(12) United States Patent
Kodaira et al.

(10) Patent No.: US 11,329,093 B2
(45) Date of Patent: May 10, 2022

(54) PHOTOELECTRIC CONVERSION APPARATUS, EQUIPMENT INCLUDING PHOTOELECTRIC CONVERSION APPARATUS, AND MANUFACTURING METHOD OF PHOTOELECTRIC CONVERSION APPARATUS

(71) Applicant: CANON KABUSHIKI KAISHA, Tokyo (JP)

(72) Inventors: Shinji Kodaira, Tokyo (JP); Takehito Okabe, Yokohama (JP); Mitsuhiro Yomori, Tama (JP); Nobuyuki Endo, Fujisawa (JP); Tomoyuki Tezuka, Sagamihara (JP); Toshihiro Shoyama, Kawasaki (JP); Jun Iwata, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/840,208

(22) Filed: Apr. 3, 2020

(65) Prior Publication Data

US 2020/0235157 A1 Jul. 23, 2020

Related U.S. Application Data

(63) Continuation of application No. 16/030,717, filed on Jul. 9, 2018, now Pat. No. 10,644,055.

(30) Foreign Application Priority Data

Jul. 11, 2017 (JP) .............................. JP2017-135608

(51) Int. Cl.
*H01L 27/146* (2006.01)
*H04N 5/369* (2011.01)

(52) U.S. Cl.
CPC .... *H01L 27/14636* (2013.01); *H01L 27/1462* (2013.01); *H01L 27/14612* (2013.01);
(Continued)

(58) Field of Classification Search
CPC ........... H01L 27/14636; H01L 27/1462; H01L 27/14612; H01L 27/14685;
(Continued)

(56) References Cited

U.S. PATENT DOCUMENTS 7,622,319 B2 * 11/2009 Park ................................ 438/48
8,802,478 B2 * 8/2014 Kato ................. H01L 27/14609
438/59

(Continued)

FOREIGN PATENT DOCUMENTS

JP 2015-207671 A 11/2015
JP 2017-055080 A 3/2017

*Primary Examiner* — Padma Haliyur
(74) *Attorney, Agent, or Firm* — Canon U.S.A., Inc. I.P. Division

(57) ABSTRACT

A photoelectric conversion apparatus includes a semiconductor substrate including a photoelectric conversion portion, a metal containing portion provided on the semiconductor substrate, an interlayer insulation film arranged on the semiconductor substrate to cover the metal containing portion, a first silicon nitride layer arranged on the photoelectric conversion portion to include a portion lying between the interlayer insulation film and the semiconductor substrate, a silicon oxide film including a portion arranged between the first silicon nitride layer and the photoelectric conversion portion, and a portion arranged between the interlayer insulation film and the metal containing portion, a second silicon nitride layer arranged between the silicon oxide film and the metal containing portion.

21 Claims, 10 Drawing Sheets

(52) U.S. Cl.
CPC .. *H01L 27/14623* (2013.01); *H01L 27/14685* (2013.01); *H04N 5/369* (2013.01)

(58) Field of Classification Search
CPC ......... H01L 27/14623; H01L 27/14609; H01L 27/14625; H01L 27/14643; H01L 27/14683; H04N 5/369
See application file for complete search history.

(56) References Cited

U.S. PATENT DOCUMENTS

| | | | |
|---|---|---|---|
| 2011/0159632 A1* | 6/2011 | Sueyoshi | C23C 16/345 438/72 |
| 2015/0179700 A1* | 6/2015 | Okabe | H01L 27/14685 438/59 |
| 2016/0111456 A1* | 4/2016 | Tomimatsu | H01L 27/1462 257/292 |
| 2017/0263670 A1* | 9/2017 | Kawahara | H01L 27/14645 |
| 2018/0331140 A1* | 11/2018 | Sato | H04N 5/3745 |

* cited by examiner

FIG.8P1
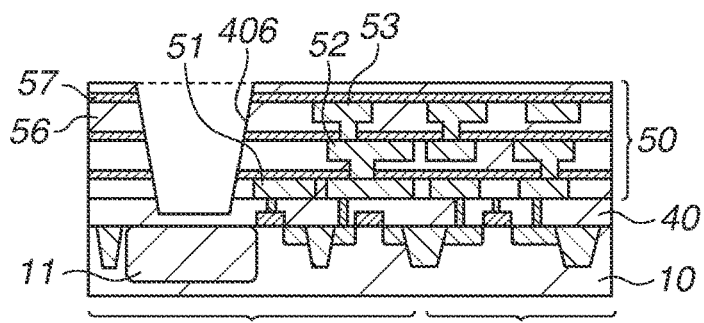
FIG.8P2
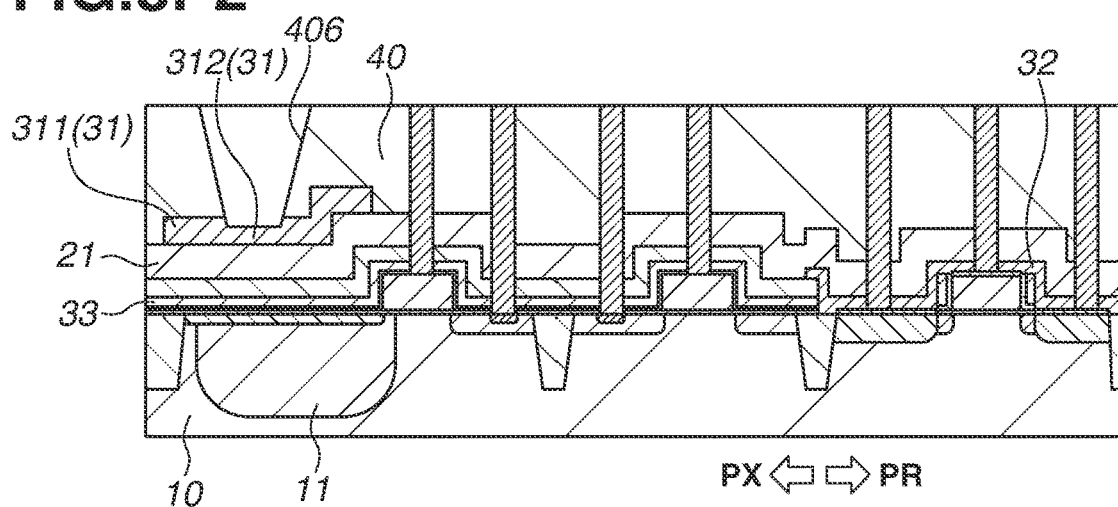
FIG.8Q1
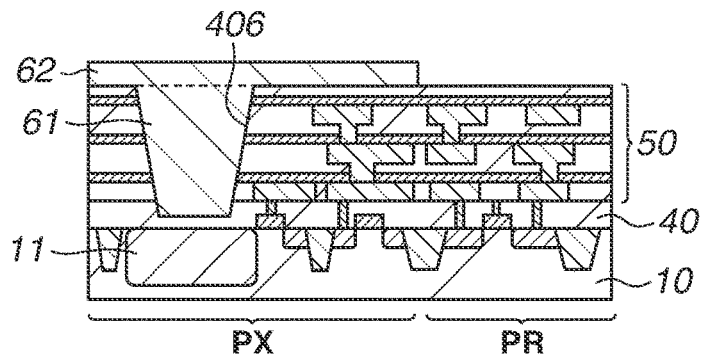
FIG.8Q2
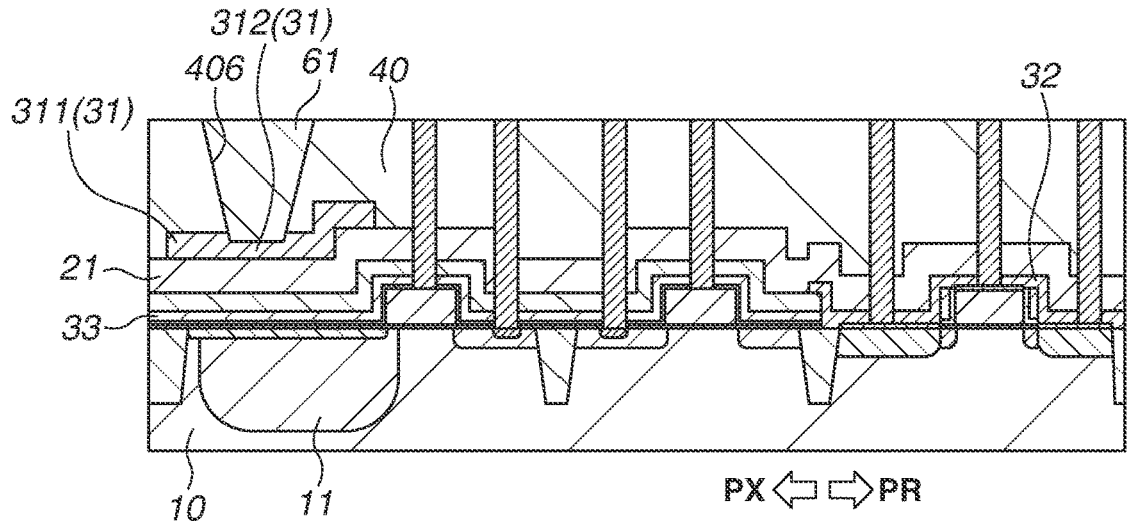

PHOTOELECTRIC CONVERSION APPARATUS, EQUIPMENT INCLUDING PHOTOELECTRIC CONVERSION APPARATUS, AND MANUFACTURING METHOD OF PHOTOELECTRIC CONVERSION APPARATUS

CROSS-REFERENCE TO RELATED APPLICATIONS

This application is a continuation of U.S. patent application Ser. No. 16/030,717, filed on Jul. 9, 2018, which claims the benefit of Japanese Patent Application No. 2017-135608, filed on Jul. 11, 2017, both of which are hereby incorporated by reference herein in their entirety.

BACKGROUND OF THE INVENTION

Field of the Invention

The present invention relates to a photoelectric conversion apparatus.

Description of the Related Art

In a photoelectric conversion apparatus, a photoelectric conversion portion and elements other than the photoelectric conversion portion are provided on the same semiconductor substrate. An antireflection structure and a waveguide structure are provided on the photoelectric conversion portion. Contact plugs are connected to the elements. The photoelectric conversion apparatus therefore needs to be designed in consideration of characteristics of both the photoelectric conversion portion and the other elements.

Japanese Patent Application Laid-Open No. 2010-56516 discusses forming a silicide block film (71) on a photoelectric conversion portion (21) from a film of the same layer as a sidewall formation film (137) having a layered structure including a silicon oxide film (134) and a silicon nitride film (135). An etching stopper film (74) made of a silicon nitride film is discussed to be further formed over the entire surface of a pixel portion (12) and a peripheral circuit portion (13). A waveguide (23) is discussed to be formed on the photoelectric conversion portion (21).

Japanese Patent Application Laid-Open No. 2013-84740 discusses a control film (410) serving as an etching stopper in forming an opening (421) intended for a light guide member (420), and a protection film (250) serving as an etching stopper for forming a contact hole in a peripheral circuit region. The control film (410) and the protection film (250) are discussed to be formed from the same silicon nitride film.

Japanese Patent Application Laid-Open No. 2014-56878 discusses forming a waveguide that runs through an interlayer insulation film (IF1) and a contact etch stress liner film (CESL), which is a silicon nitride film, to reach a sidewall insulation film (SWI), which is a silicon nitride film.

According to the conventional techniques, noise may occur due to contamination or damage to the photoelectric conversion portion. This can lower the quality of photoelectric conversion. In addition, the reliability of electrical connection with the elements other than the photoelectric conversion portion is important in securing the reliability of the photoelectric conversion apparatus. According to the conventional techniques, the improvement of the performance and reliability of the photoelectric conversion apparatus is not sufficient.

The present invention is directed to providing a photoelectric conversion apparatus of improved performance and reliability.

SUMMARY OF THE INVENTION

According to an aspect of the present invention, a photoelectric conversion apparatus includes a semiconductor substrate including a photoelectric conversion portion, a metal containing portion provided on the semiconductor substrate not to overlap with at least part of the photoelectric conversion portion, an interlayer insulation film arranged on the semiconductor substrate to cover the metal containing portion, a first silicon nitride layer arranged on the photoelectric conversion portion to include a portion lying between the interlayer insulation film and the semiconductor substrate, a silicon oxide film including a portion arranged between the first silicon nitride layer and the photoelectric conversion portion, and a portion arranged between the interlayer insulation film and the metal containing portion, a second silicon nitride layer arranged between the silicon oxide film and the metal containing portion, a contact plug running through the interlayer insulation film, the silicon oxide film, and the second silicon nitride layer and being in contact with the metal containing portion, and a contact plug running through the interlayer insulation film and the silicon oxide film and being in contact with the semiconductor substrate.

According to another aspect of the present invention, a photoelectric conversion apparatus includes a semiconductor substrate including a photoelectric conversion portion, a metal containing portion provided on the semiconductor substrate not to overlap with at least part of the photoelectric conversion portion, a first silicon nitride layer arranged on the photoelectric conversion portion, a distance between the photoelectric conversion portion and the first silicon nitride layer being smaller than a distance between a wiring layer and the semiconductor substrate, a silicon oxide film including a portion arranged between the first silicon nitride layer and the photoelectric conversion portion, and a portion arranged on the metal containing portion, a second silicon nitride layer arranged between the silicon oxide film and the metal containing portion, and a contact plug running through the silicon oxide film and the second silicon nitride layer and being in contact with the wiring layer and the metal containing portion.

According to yet another aspect of the present invention, a photoelectric conversion apparatus includes a semiconductor substrate including a photoelectric conversion portion, an electrode arranged on the semiconductor substrate, a sidewall spacer configured to cover a side surface of the electrode, an interlayer insulation film arranged on the semiconductor substrate to cover the electrode and the sidewall spacer, a first silicon nitride layer arranged on the photoelectric conversion portion, a silicon oxide film including a portion arranged between the first silicon nitride layer and the photoelectric conversion portion, the silicon oxide film being located between the interlayer insulation film and the sidewall spacer, a second silicon nitride layer including a portion arranged between the silicon oxide film and the sidewall spacer, and a contact plug running through the interlayer insulation film, the silicon oxide film, and the silicon nitride layer and being connected to an element including the electrode, a distance between the photoelectric conversion portion and the first silicon nitride layer being smaller than a length of the contact plug.

According to yet another aspect of the present invention, a manufacturing method of a photoelectric conversion apparatus includes forming a first silicon nitride film to cover a metal containing portion on a semiconductor substrate, forming a silicon oxide film on the first silicon nitride film to cover a photoelectric conversion portion provided in the semiconductor substrate, forming a second silicon nitride film to cover the photoelectric conversion portion, forming an interlayer insulation film to cover a portion of the first silicon nitride film, the portion lying on the metal containing portion, and a portion of the second silicon nitride film, the portion lying on the photoelectric conversion portion, forming a hole in the interlayer insulation film and the first silicon nitride film, the hole being located above the metal containing portion, and arranging a conductor in the hole.

According to yet another aspect of the present invention, a manufacturing method of a photoelectric conversion apparatus includes forming a first silicon nitride film to cover a metal containing portion on a semiconductor substrate, forming a second silicon nitride film to cover a photoelectric conversion portion and the metal containing portion and, the photoelectric conversion portion being provided in the semiconductor substrate, forming an interlayer insulation film to cover a portion of the first silicon nitride film, the portion lying on the metal containing portion, and a portion of the second silicon nitride film, the portion lying on the photoelectric conversion portion, forming a hole in the interlayer insulation film and the first silicon nitride film, the hole being located above the metal containing portion, and arranging a conductor in the hole, wherein the second silicon nitride film is thicker than the first silicon nitride film.

Further features of the present invention will become apparent from the following description of exemplary embodiments with reference to the attached drawings.

BRIEF DESCRIPTION OF THE DRAWINGS

FIGS. 8P1, 8P2, 8Q1, and 8Q2 are schematic diagrams for describing the manufacturing method of the photoelectric conversion apparatus.

DESCRIPTION OF THE EMBODIMENTS

Figure 1A:
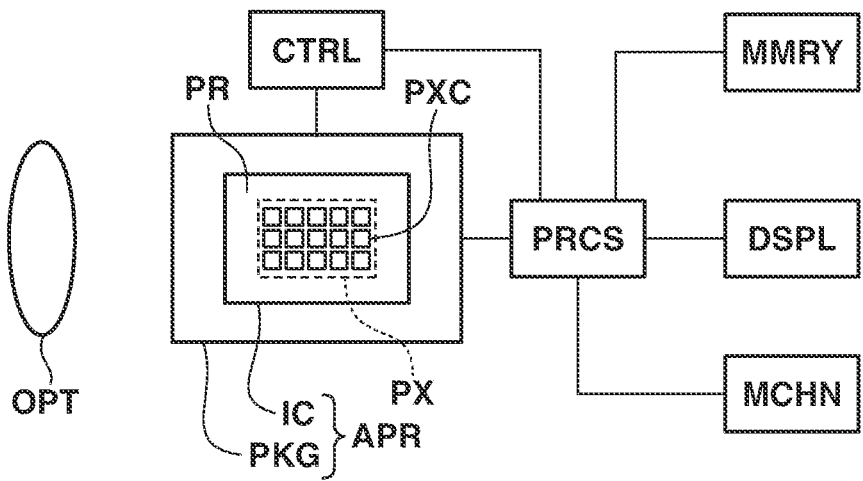
FIGS. 1A and 1B are schematic diagrams for describing a photoelectric conversion apparatus.

A mode for carrying out the present invention will be described below with reference to the drawings. In the following description and the drawings, configurations common to a plurality of drawings are designated by the same reference numerals. The common configurations will therefore be described with cross reference to the plurality of drawings. A description of the configurations designated by the same reference numerals will be omitted as appropriate. Configurations referred to by the same names and designated by different reference numerals can be distinguished like a first configuration, a second configuration, a third configuration, and so on.

FIG. 1A is a schematic diagram illustrating equipment EQP which includes a photoelectric conversion apparatus APR according to an exemplary embodiment of the present invention. The photoelectric conversion apparatus APR includes a semiconductor device IC. The semiconductor device IC is a semiconductor chip including a semiconductor integrated circuit. In addition to the semiconductor device IC, the photoelectric conversion apparatus APR can include a package PKG which accommodates the semiconductor device IC. The photoelectric conversion apparatus APR can be used as an image sensor, an auto focus (AF) sensor, a light metering sensor, or a distance measurement sensor.

The equipment EQP can further include at least any one of an optical system OPT, a control apparatus CTRL, a processing apparatus PRCS, a display apparatus DSPL, a storage apparatus MMRY, and a mechanical apparatus MCHN. Details of the equipment EQP will be described below.

The semiconductor device IC includes a pixel area PX in which pixel circuits PXC including photoelectric conversion portions are two-dimensionally arranged. The semiconductor device IC can include a peripheral area PR around the pixel area PX. The peripheral area PR can include a driving circuit for driving the pixel circuits PXC, a signal processing circuit for processing signals from the pixel circuits PXC, and a control circuit for controlling the driving circuit and the signal processing circuit. The signal processing circuit can perform signal processing such as correlated double sampling (CDS) processing, amplification processing, and analog-digital (AD) conversion processing. As another example of the semiconductor device IC, at least part of the peripheral circuits to be arranged in the peripheral area PR can be arranged on a semiconductor chip other than the semiconductor chip on which the pixel area PX is provided, and the two semiconductor chips can be stacked.

Figure 1B:
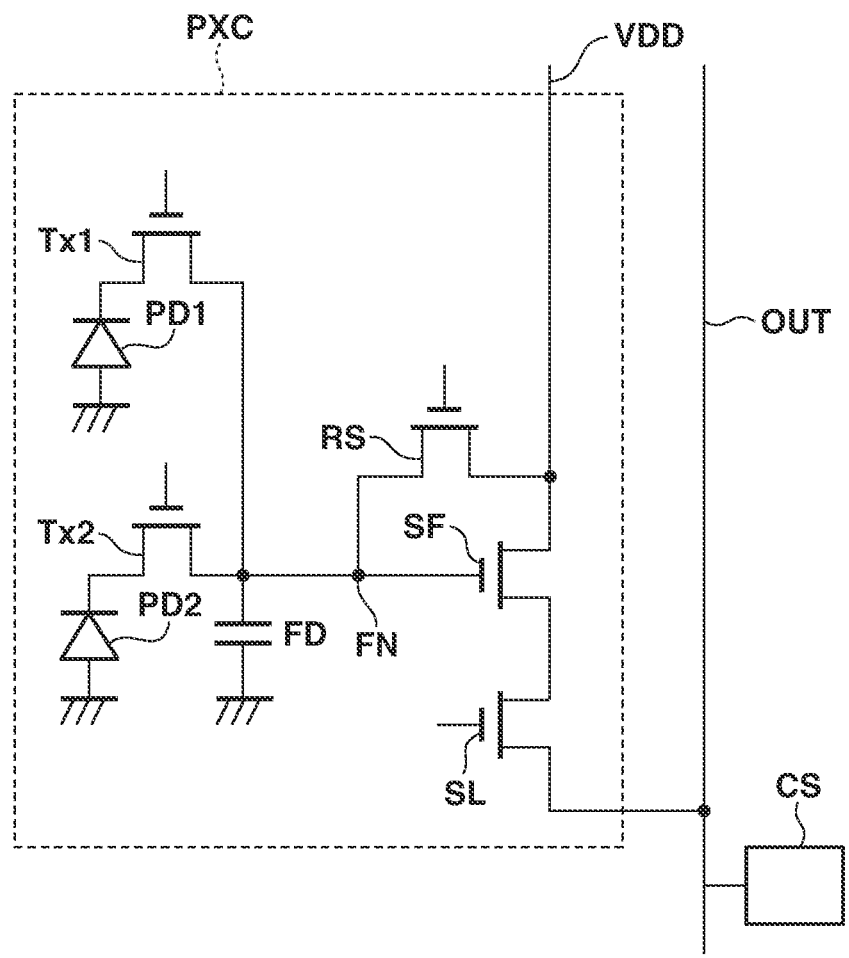

FIG. 1B is a diagram illustrating an example of a pixel circuit PXC. The pixel circuit PXC includes a photoelectric conversion element PD1, a photoelectric conversion element PD2, a transfer gate TX1, a transfer gate TX2, and a capacitive element FD. The pixel circuit PXC can also include an amplification transistor SF, a reset transistor RS, and a selection transistor SL. The photoelectric conversion elements PD1 and PD2 are a photodiode or a photogate each. The transfer gates TX1 and TX2 are metal-insulator-semiconductor (MIS) gates. The amplification transistor SF, the reset transistor RS, and the selection transistor SL are MIS transistors. The amplification transistor SF can be a junction field-effect transistor. In the present example, the two photoelectric conversion elements PD1 and PD2 share the one amplification transistor SF. Alternatively, three or more photoelectric conversion elements can share the one amplification transistor SF, and the photoelectric conversion element PD1 and PD2 can be provided with respective amplification transistors SF. The amplification transistor SF, the reset transistor RS, and the selection transistor SL can have a common structure. The reset transistor RS, the selection transistor SL, and the amplification transistor SF will be referred to collectively as pixel transistors. The transfer gates TX1 and TX2, the pixel transistors, and peripheral transistors are semiconductor elements each including a gate electrode. The photoelectric conversion apparatus APR can include other semiconductor elements such as a diode, a resistive element, and a capacitive element.

Signal charges generated by the photoelectric conversion elements PD1 and PD2 are transferred to a floating node FN of the capacitive element FD via the transfer gates TX1 and TX2. The gate of the amplification transistor SF which is included in a source follower circuit with a current source CS is connected to the floating node FN. A pixel signal serving as a voltage signal is output to a signal output line OUT. The reset transistor RS resets the charge or potential of the floating node FN. The selection transistor SL switches connection between the amplification transistor SF and the signal output line OUT. The reset transistor RS and the amplification transistor SF are connected to a power supply line VDD. The signal output line OUT and the power supply line VDD are provided for each column of pixel circuits PXC. Focus detection and distance measurement by a phase difference detection method can be performed based on a difference between the signals of the respective photoelectric conversion elements PD1 and PD2. Imaging can be performed by using either one or both of the signals of the photoelectric conversion elements PD1 and PD2.

Figure 2A:
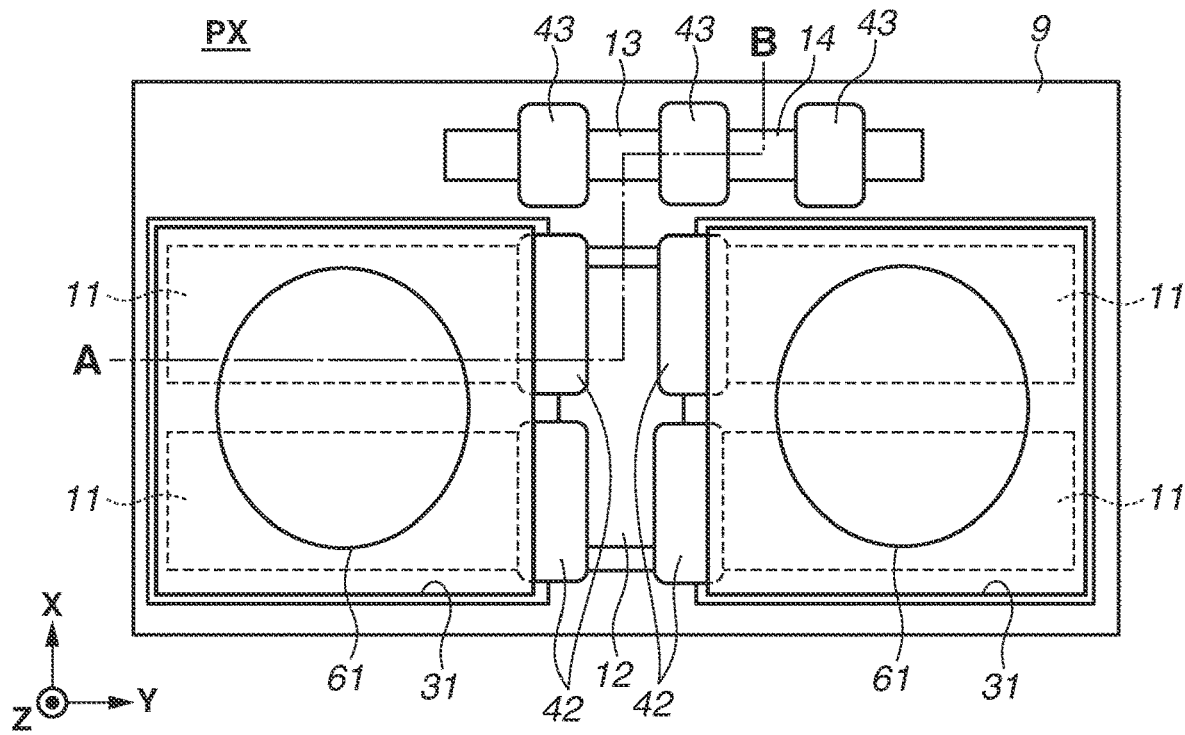
FIGS. 2A and 2B are schematic diagrams for describing a structure of the photoelectric conversion apparatus.
Figure 2B:
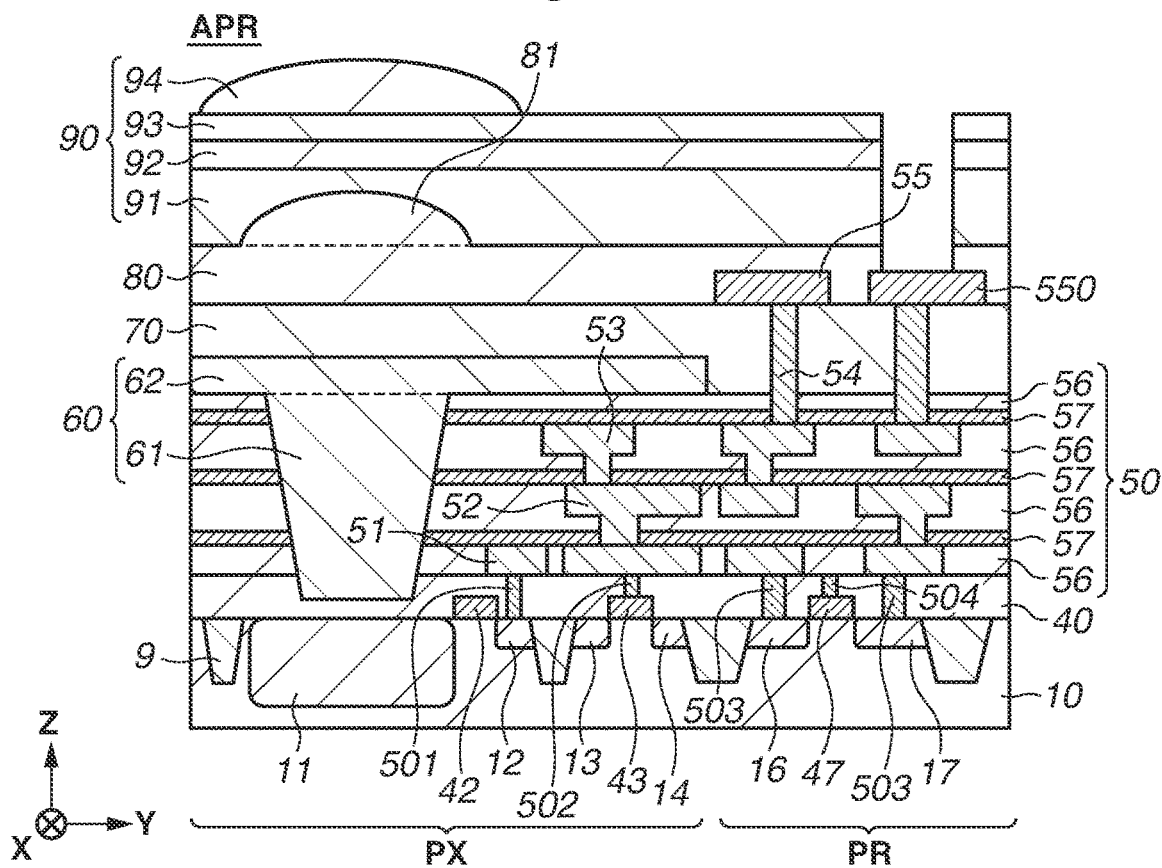

FIG. 2A is a schematic plan view near the surface of a pixel area PX of a semiconductor substrate 10 included in the photoelectric conversion apparatus APR. FIG. 2B is a schematic sectional view of the photoelectric conversion apparatus APR, including a cross section taken along the line A-B of FIG. 2A. The structure of the photoelectric conversion apparatus APR will be described below without a distinction between the plan view and the sectional view. A column direction, i.e., a direction in which pixels of a pixel column of the pixel area PX are arranged will be referred to as an X direction. A row direction, i.e., a direction in which pixels of a pixel row of the pixel area PX are arranged will be referred to as a Y direction. A thickness direction indicating the thicknesses of layers and films will be referred to as a Z direction. The X, Y, and Z directions are orthogonal to each other.

A first exemplary embodiment is characterized by a positional relationship between members (layers or films) made of silicon oxide and members (layers or films) made of silicon nitrides. Silicon oxide members described as separate members are either ones between which a member made of a different material is interposed or ones that are made of similar materials with different compositions. The same applies to silicon nitride members. A film refers to a two-dimensionally continuous one. A layer can be two-dimensionally discontinuous. In the following description, silicon oxide refers to a compound of oxygen (O) and silicon (Si), in which the top two elements in terms of the composition ratios of the constituent elements, other than light elements (hydrogen (H) and helium (He)), are oxygen (O) and silicon (Si). Silicon oxide can contain light elements such as hydrogen (H), the amount (atom %) of which may be greater than or smaller than those of oxygen (O) and silicon (Si). Silicon oxide can contain elements other than oxygen (O), silicon (Si), hydrogen (H), or helium (He), at a concentration lower than those of oxygen (O) and silicon (Si). Typical elements that can be contained in silicon oxide include hydrogen (H), boron (B), carbon (C), nitrogen (N), fluorine (F), phosphorus (P), chlorine (Cl), and argon (Ar).

If the third richest element among the constituent elements of silicon oxide other than light elements is nitrogen, this silicon oxide may be referred to as silicon nitride oxide or nitrogen-containing silicon oxide.

Similarly, silicon nitride refers to a compound of nitrogen (N) and silicon (Si), in which the top two elements in terms of the composition ratios of the constituent elements, other than light elements, are nitrogen (N) and silicon (Si). Silicon nitride can contain elements other than nitride (N), silicon (Si), or light elements, at a concentration lower than those of nitride (N) and silicon (Si). Typical elements that can be contained in silicon nitride include boron (B), carbon (C), oxygen (O), fluorine (F), phosphorus (P), chlorine (Cl), and argon (Ar). If the third richest element among the constituent elements of silicon nitrogen other than light elements is oxygen, this silicon nitride may be referred to as silicon oxide nitride or oxygen-containing silicon nitride. The elements contained in the component members of the photoelectric conversion apparatus APR can be analyzed by energy dispersive X-ray spectrometry (EDX). Hydrogen content can be analyzed by elastic recoil detection analysis (ERDA).

The pixel area PX of the semiconductor substrate 10 includes photoelectric conversion portions 11, a charge detection portion 12, drains 13 of pixel transistors, and sources 14 of the pixel transistors, which are provided in an element region defined by an element isolation region 9. The peripheral area PR of the semiconductor substrate 10 includes sources 16 and drains 17 of peripheral transistors, which are provided in the element region defined by the element isolation region 9.

Gate electrodes 42 of the transfer gates TX1 and TX2 and gate electrodes 43 of the pixel transistors are provided on the semiconductor substrate 10. Dielectric regions 61 are arranged on the photoelectric conversion portions 11 via a silicon nitride layer 31. In FIG. 2A, the silicon nitride layer 31 and the dielectric regions 61 are illustrated in outlines. Gate electrodes 47 of the peripheral transistors are arranged on the semiconductor substrate 10. The peripheral transistors are transistors arranged in the peripheral area PR. Examples of the peripheral transistors include an n-type metal-oxide-semiconductor (NMOS) transistor and a p-type metal-oxide-semiconductor (PMOS) transistor which constitute a complementary metal-oxide-semiconductor (CMOS) circuit. In the present example, a PMOS transistor is illustrated.

Contact plugs 501, 502, 503, and 504 running through an interlayer insulation film 40 are arranged on the semiconductor substrate 10. The contact plugs 501, 502, 503, and 504 are conductive members including a barrier metal, such as titanium and titanium nitride, and a conductor, such as tungsten. Typically, the barrier metal of the contact plugs 501, 502, 503, and 504 makes contact with the interlayer insulation film 40. The contact plugs 501, 502, 503, and 504 are provided in holes (contact holes) formed in the films and layers to be penetrated. The contact plugs 501 are connected to the charge detection portions 12 and the drains 13. The contact plugs 502 are connected to the gate electrodes 42 and 43. The contact plugs 503 are connected to the sources 16 and drains 17. The contact plugs 504 are connected to the gate electrodes 47.

Interlayer insulation films 50 and 70 are arranged on the semiconductor substrate 10. The interlayer insulation film 50 is a stacked film including interlayer insulation layers 56 and diffusion prevention layers 57. Wiring layers 51, 52, and 53 covered with the diffusion prevention layers are provided between the plurality of interlayer insulation layers 56. The wiring layer 51 is in contact with the contact plugs 501, 502, 503, and 504. The number of silicon carbide layers including the diffusion prevention layers 57 may be one time or more and not more than twice the number of layers of copper wiring layers. In the present example, the number of silicon carbide layers is three, and the number of copper wiring layers is three. The interlayer insulation layers 56 are silicon oxide layers. The silicon oxide layers desirably contain 5% to 30% by atom of hydrogen. The diffusion prevention layers 57 are silicon carbide layers. The silicon carbide layers can contain 20% to 60% by atom of hydrogen.

A dielectric member 60 is provided on the semiconductor substrate 10. The dielectric member 60 is a member into which the dielectric regions 61 surrounded by the interlayer insulation films 40 and 50 and a dielectric film 62 lying on the interlayer insulation film 50 are integrated. In the present example, sensitivity can be improved by arranging the dielectric regions 61 across a plurality of photoelectric conversion portions 11 as illustrated in FIG. 2A. Light separation accuracy can be increased by arranging the dielectric regions 61 for the respective plurality of photoelectric conversion portions 11. The dielectric member 60 is made of silicon oxide, silicon nitride, and/or resin. A refractive index of the dielectric member 60 is desirably higher than that of the interlayer insulation layers 56. The refractive index of the dielectric member 60 can be equal to that of the interlayer insulation layers 56, or lower than that of the interlayer insulation layers 56. The refractive index of the dielectric member 60 can be lower than that of the diffusion prevention layers 57. Interfaces between the dielectric regions 61 and the dielectric film 62 are defined by a virtual plane (dotted line in FIG. 2B) including the top surface of the interlayer insulation film 50. The interlayer insulation film 70 covers the dielectric member 60. A wiring layer 55 on the interlayer insulation film 70 is connected to the wiring layer 53 through via plugs 54 which run through the interlayer insulation film 70. The interlayer insulation film 70 is a silicon oxide film. The silicon oxide film can contain 5% to 30% by atom of hydrogen. An inorganic material film 80 including in-layer lenses is provided on the interlayer insulation film 70. The inorganic material film 80 can function as a passivation film or an antireflection film. The inorganic material film 80 can be a multilayer film including at least two layers among a silicon nitride layer, a silicon oxide nitride layer, a silicon nitride oxide layer, and a silicon oxide layer. An organic material film 90 including a planarization layer 91, a color filter layer 92, a planarization layer 93, and a microlens layer 94 is provided on the inorganic material film 80. The color filter layer 92 constitutes a multicolor filter array. The microlens layer 94 constitutes a microlens array.

Figure 3:
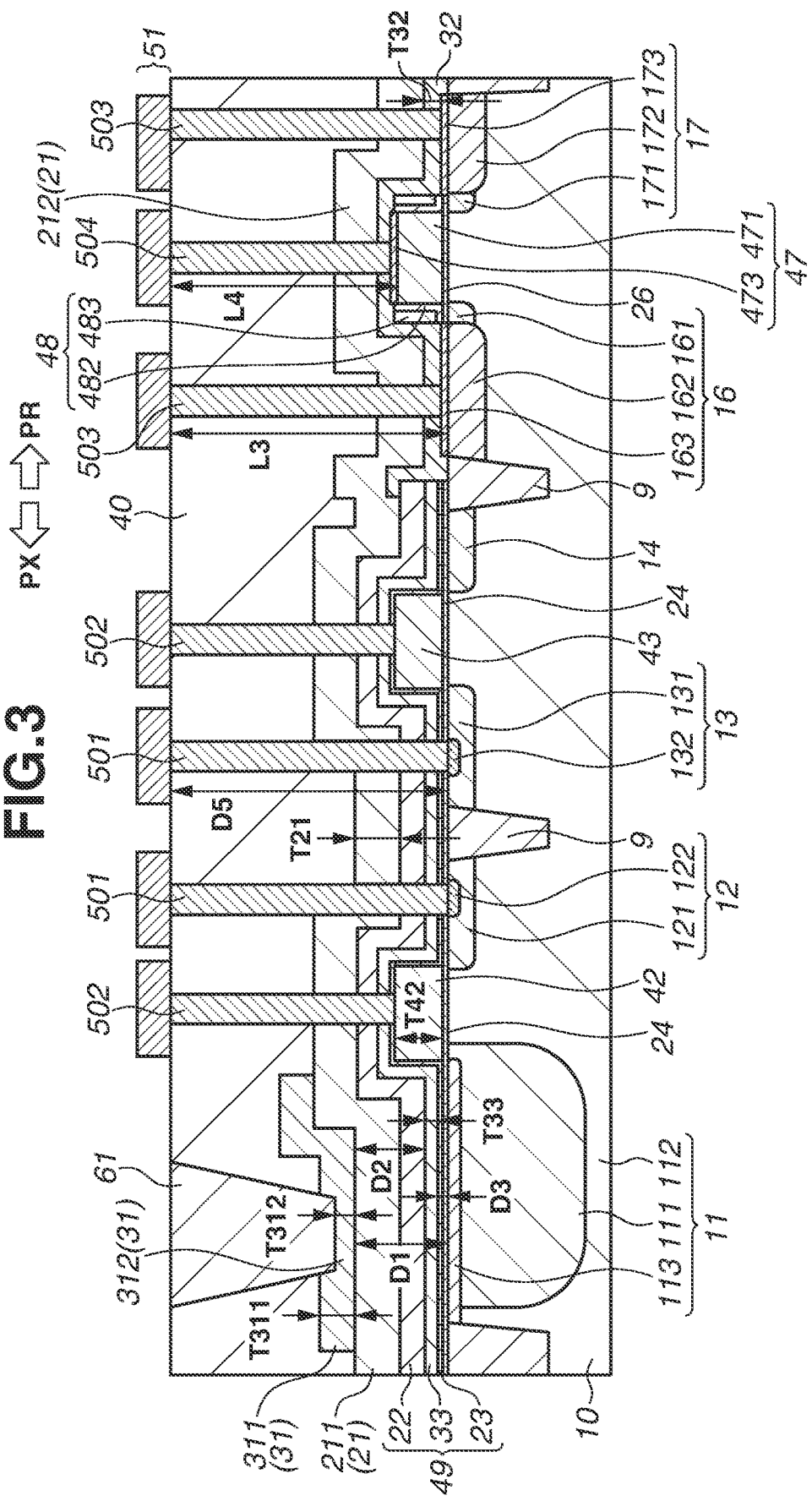
FIG. 3 is a schematic diagram for describing the structure of the photoelectric conversion apparatus.

FIG. 3 is a schematic sectional view illustrating a detailed configuration between the semiconductor substrate 10, the interlayer insulation film 40, and a dielectric region 61 in the photoelectric conversion apparatus APR described with reference to FIGS. 2A and 2B.

The photoelectric conversion portion 11 constitutes the photoelectric conversion elements PD1 and PD2 serving as photodiodes. The photoelectric conversion portion 11 includes an n-type semiconductor region 111 serving as a charge storage region (cathode) and a p-type semiconductor region 112 serving as a well region (anode). The semiconductor region 112 is provided in a deeper part of the semiconductor substrate 10 than the semiconductor region 111 is. The photoelectric conversion portion 11 includes a p-type semiconductor region 113 serving as a surface isolation region. The semiconductor region 113 is provided between the semiconductor region 111 and the surface of the semiconductor substrate 10. The semiconductor region 113 makes the photoelectric conversion portion 11 into an embedded photodiode.

For example, the gate electrodes 42 and 43 are n-type polysilicon electrodes. The gate electrode 42 has a thickness T42 of, for example, 50 to 300 nm, and typically 100 to 200 nm. The gate electrode 43 has a thickness equivalent to the thickness T42. The gate electrode 47 includes a polycide structure including a p-type polysilicon portion 471 and a metal containing portion 473. The gate electrode 47 can have a thickness greater than or equivalent to the thickness T42. Semiconductor elements such as resistive elements and capacitive elements arranged in the peripheral area PR can also include polysilicon electrodes, which can have similar configurations to those of the gate electrodes 42, 43, and 47. The contact plug 504 is in contact with the metal containing portion 473. A sidewall spacer 48 is a multilayer member including a silicon nitride layer 483 and a silicon oxide layer 482. The silicon oxide layer 482 lies between the silicon nitride layer 483 and the side surface of the gate electrode 47 and between the silicon nitride layer 483 and the semiconductor substrate 10 (semiconductor regions 151 and 161).

A gate insulation film 24 is arranged between the gate electrodes 42 and 43 and the semiconductor substrate 10. A gate insulation film 26 is arranged between the gate electrode 47 and the semiconductor substrate 10. The gate insulation film 26 can be made thinner than the gate insulation film 24. For example, the gate insulation film 24 has a thickness of 5 to 10 nm. The gate insulation film 26 has a thickness of 1 to 5 nm. The gate insulation films 24 and 26 may be nitrogen-containing silicon oxide films.

The sidewall spacer 48 of the gate electrode 47 is provided to cover the side surface of the gate electrode 47.

The charge detection portion 12 constituting the capacitive element FD includes a lightly doped n-type semiconductor region 121 and a highly doped n-type semiconductor region 122. The semiconductor region 121 functions as a floating diffusion region. The semiconductor region 121 is located under a contact plug 501, and functions as a contact region with which the contact plug 501 makes contact. A metal compound (silicide) of the metal component of the contact plug 501 and the semiconductor component of the semiconductor substrate 10 can be formed between the contact plug 501 and the semiconductor substrate 10 (semiconductor regions 122 and 132). Even in such a case, the contact plugs 501 can be said to be in contact with the semiconductor substrate 10 (semiconductor regions 122 and 132). The metal component of the contact plug 501 to form the compound with the semiconductor substrate 10 can be a metal (for example, titanium) included in the barrier metal of the contact plug 501. The drain 13 includes a lightly doped n-type semiconductor region 131 and a highly doped n-type semiconductor region 132. The semiconductor region 131 is located under a contact plug 501, and functions as a contact region with which the contact plug 501 makes contact. The source 16 includes a lightly doped p-type semiconductor region 161 serving as a lightly doped drain (LDD) region, an intermediately doped p-type semiconductor region 162, and a metal containing portion 163. The drain 17 similarly includes a lightly doped p-type semiconductor region 171, an intermediately doped p-type semiconductor region 172, and a metal containing portion 173. The semiconductor regions 161 and 171 are located under the sidewall spacer 48. The semiconductor regions 162 and 172 lie under the metal containing portions 163 and 173. The contact plugs 503 are in contact with the metal containing portions 163 and 173. While the metal containing portions 163, 173, and 473 are provided for the source 16, the drain 17, and the gate electrode 47 of the peripheral transistor, any one of the metal containing portions can be provided. The pixel transistor can also include metal containing portions, though with increased noise production. If the pixel transistor includes metal containing portions, the metal containing portions can therefore be limitedly arranged only under the contact plugs 501 and 502.

The metal containing portions 163, 173, and 473 are regions containing metal, and are made of the metal or a metal compound. Examples of the metal contained in the metal containing portions 163, 173, and 473 include cobalt (Co), nickel (Ni), titanium (Ti), tantalum (Ta), and tungsten (W). The metal containing portions 163, 173, and 473 typically are portions made of a semiconductor metal compound, and more typically are portions made of a silicon metal compound, i.e., silicide (silicide portions). Suitable silicides include cobalt silicide, nickel silicide, tungsten silicide, and titanium silicide. The metal containing portions 163, 173, and 473 can be a compound of metal and germanium. The metal containing portion 473 can be a metal nitride such as tantalum nitride, titanium nitride, and aluminum nitride, or a metal carbide. The metal containing portions 163, 173, and 473 are provided for the purpose of reducing the resistances between the transistor and the contact plugs 503 and 504. The metal containing portions 163, 173, and 473 can be provided for other purposes, such as for making the gate electrode into a metal gate. The metal containing portions 163, 173, and 473 can be provided as light shielding members for the semiconductor substrate 10. The metal containing portions 163, 173, and 473 are arranged not to overlap with at least the photoelectric conversion portion 11, so that the photoelectric conversion portion 11 can receive light. In the present example, the metal containing portions 163, 173, and 473 do not overlap with the photoelectric conversion portion 11, since the metal containing portions 163, 173, and 473 are arranged in the peripheral area PR. Even if the metal containing portions 163, 173, and 473 are arranged in the pixel area PX, it is desirable that the metal containing portions 163, 173, and 473 are arranged not to overlap with the photoelectric conversion portion 11.

The photoelectric conversion apparatus APR includes the silicon nitride layer 31, a silicon oxide film 21, and a silicon nitride layer 32 which are arranged on the semiconductor substrate 10. The contact plugs 501 and 502 run through the silicon oxide film 21 in addition to the interlayer insulation film 40. The contact plugs 501 and 502 are in contact with the silicon oxide film 21 in addition to the interlayer insulation film 40. Typically, the barrier metal of the contact plugs 501 and 502 makes contact with the interlayer insulation film 40 and the silicon oxide film 21. The contact plugs 503 and 504 run through the silicon oxide film 21 and the silicon nitride layer 32 in addition to the interlayer insulation film 40. The contact plugs 503 and 504 are in contact with the silicon oxide film 21 and the silicon nitride layer 32. Typically, the barrier metal of the contact plugs 503 and 504 makes contact with the silicon oxide film 21 and the silicon nitride layer 32.

The silicon nitride layer 31 is arranged on the photoelectric conversion portion 11 to include a portion 311 lying between the interlayer insulation film 40 and the semiconductor substrate 10. The silicon nitride layer 31 also includes a portion 312 arranged between the dielectric region 61 and the photoelectric conversion portion 11. The portion 312 of the silicon nitride layer 31 can have a thickness T312 smaller than a thickness T311 of the portion 311 of the silicon nitride layer 31 (T312<T311). The thickness T312 can be 25% to 75% of the thickness T311. For example, the thickness T311 is 30 to 120 nm. For example, the thickness T312 is 10 to 60 nm. If the dielectric region 61 is not provided, the silicon nitride layer 31 can be entirely located between the interlayer insulation film 40 and the semiconductor 10, and the silicon nitride layer 31 can have a substantially uniform thickness entirely (thickness distribution of ±10% or less). The silicon nitride layer 31 above the photoelectric conversion portion 11 functions as a protection layer by itself, and can thus reduce damage and stain to the photoelectric conversion portion 11 when the photoelectric conversion apparatus APR is manufactured and when in use.

To improve optical characteristics of the silicon nitride layer 31 with respect to the photoelectric conversion portion 11, the silicon nitride layer 31 is desirably located somewhat close to the photoelectric conversion portion 11. A distance D1 between the silicon nitride layer 31 and the photoelectric conversion portion 11 can be smaller than a distance D5 between the semiconductor substrate 10 and the wiring layer 51 (D1<D5). The distance D1 between the silicon nitride layer 31 and the photoelectric conversion portion 11 can be smaller than a length L3 of the contact plugs 503 (D1<L3), and can also be smaller than the length of the contact plugs 501. The length of the contact plugs 501 can be considered to be equal to the length L3 of the contact plugs 503. The distance D1 between the silicon nitride layer 31 and the photoelectric conversion portion 11 can be smaller than a length L4 of the contact plug 504 (D1<L4), and can also be smaller than the length of the contact plugs 502. The length of the contact plugs 502 can be considered to be equal to the length L4 of the contact plug 504. The distance D5 is almost equal to the length L3. The distance D5 can be smaller than the length L3 (D5≤L3).

The silicon oxide film 21 is arranged between the interlayer insulation film 40 and the semiconductor substrate 10. The silicon oxide film 21 includes a portion 211 provided in the pixel area PX and a portion 212 provided in the peripheral area PR. The portion 211 is arranged at least between the silicon nitride layer 31 and the photoelectric conversion portion 11. The portion 212 is arranged at least between the interlayer insulation film 40 and the peripheral transistor. The top surface of the silicon oxide film 21, i.e., the surface on the side of the interlayer insulation film 40 (surface opposite from the side of the semiconductor substrate 10), has recesses and projections according to the shapes of the gate electrodes 42, 43, and 47. The top surface of the interlayer insulation film 40, i.e., the surface opposite from the side of the semiconductor substrate 10, is planarized and has no recess or projection according to the shapes of the gate electrodes 42, 43, and 47. The top surface of the silicon oxide film 21 on the side of the interlayer insulation film 40 therefore has a greater difference in level than that of the top surface of the interlayer insulation film 40. Both the interlayer insulation film 40 and the silicon oxide film 21 can be made of silicon oxide. The interlayer insulation film 40 and the silicon oxide film 21 can be distinguished by measuring the concentrations of silicon (Si), oxygen (O), argon (Ar), boron (B), and phosphorus (P). For example, the silicon oxide film 21 has a thickness T21 of 50 to 150 nm. A desirable difference in thickness between the portions 211 and 212 is small. The entire silicon oxide film 21 can have a substantially uniform thickness (thickness distribution of ±10% or less). If the silicon oxide film 21 includes only the portion 211, the contact plugs 503 and 504 do not run through the silicon oxide film 21.

The silicon nitride layer 32 is arranged between the silicon oxide film 21 and the peripheral transistor. The silicon nitride layer 32 covers the source 16, the drain 17, the gate electrode 47, and the sidewall spacer 48. For example, the silicon nitride layer 32 has a thickness T32 of 10 to 100 nm. The silicon nitride layer 32 can be in contact with the source 16, the drain 17, the gate electrode 47, and the sidewall spacer 48. More specifically, the silicon nitride layer 32 can be in contact with the metal containing portions 163 and 173, the silicon nitride layer 483, and the metal containing portion 473. A distance between the silicon nitride layer 32 and the metal containing portions 163, 173, and 473 can thus be zero.

Contamination via the interlayer insulation film 40 can be reduced by increasing the thickness T311 of the portion 311 of the silicon nitride layer 31. In particular, the thickness T311 is desirably made greater than the thickness T32 of the silicon nitride layer 32. The thickness T311 is desirably 110% or more of the thickness T32. The thickness T311 can be 150% or more of the thickness T32. The thickness T311 can be 300% or less of the thickness T32. The thickness T311 can be 150% or less of the thickness T32.

Damage to the photoelectric conversion portion 11 can be reduced by locating the top surface of the portion 312 as far from the semiconductor substrate 10 as possible. A distance between the top surface of the portion 312 and the semiconductor substrate 10 is expressed by the sum of the thickness T312 of the portion 312 and the distance D1 between the portion 312 and the semiconductor substrate 10 (D1+T312). The distance between the top surface of the portion 312 and the semiconductor substrate 10 is desirably greater than the thickness T42 of the gate electrode 42. The distance D1 can be increased by the provision of the silicon oxide film 21.

Contamination via the dielectric region 61 can be reduced by increasing the thickness T312 as much as possible. The thickness T312 is desirably 25% or more of the thickness T32, and more desirably 50% or more of the thickness T32. The thickness T312 can be smaller than the thickness T32. The thickness T312 can be 75% or less of the thickness T32. If the silicon nitride layer 31 has a thickness 150% or less of the thickness T32 of the silicon nitride layer 32, the thickness T32 can fall between the thicknesses T312 and T311. If the thickness T311 is sufficiently greater than the thickness T32, the thickness T312 can be greater than the thickness T32.

If the silicon oxide film 21 includes only either one of the portions 211 and 212, the underlayer of the interlayer insulation film 40 may have different levels between the pixel area PX and the peripheral area PR. If both the portions 211 and 212 are provided, the difference in the level of the underlayer of the interlayer insulation film 40 between the pixel area PX and the peripheral area PR can be reduced, compared to the case where only either one of the portions 211 and 212 is provided. This can increase the flatness of the top surface of the interlayer insulation film 40 and reduce uneven interference of light resulting from a difference in optical path length between pixels. The reliability of the contact plugs 501, 502, 503, and 504, and the reliability of the wiring layers can also be improved. The thickness T21 of the silicon oxide film 21 can be made greater than the thickness T311 of the portion 311 of the silicon nitride layer 31 and the thickness T32 of the silicon nitride layer 32 (T21>T311, T32).

The silicon nitride layer 32 can suppress metal diffusion from the metal containing portions 163, 173, and 473. The metal diffusion from the metal containing portions 163, 173, and 473 can be effectively suppressed by arranging the silicon nitride layer 32 closer to the metal containing portions 163, 173, and 473 than the portion 212 of the silicon oxide film 21 is. The smaller the distance between the silicon nitride layer 32 and the metal containing portions 163, 173, and 473, the higher the effect. As described above, the distance is desirably zero.

The photoelectric conversion apparatus APR can further include at least any one of a silicon oxide layer 22, a silicon nitride layer 33, and a silicon oxide layer 23 which are arranged on the semiconductor substrate 10. In the present example, all the three layers are included. Of the three layers, the silicon nitride layer 33 is particularly desirably provided. The silicon nitride layer 33 is arranged between the silicon oxide film 21 and the photoelectric conversion portion 11. The silicon oxide layer 22 is arranged between the silicon oxide film 21 and the silicon nitride layer 33. The silicon oxide layer 23 is arranged between the semiconductor substrate 10 and the silicon nitride layer 33. In the pixel area PX, an insulator film 49 which is a multilayer film including the silicon oxide layer 22, the silicon nitride layer 33, and the silicon oxide layer 23 covers the semiconductor substrate 10 and the gate electrodes 42 and 43. The contact plugs 501 and 502 run through the silicon oxide layer 22, the silicon nitride layer 33, and the silicon oxide layer 23 in addition to the interlayer insulation film 40. The contact plugs 501 and 502 can be in contact with the silicon oxide layer 22, the silicon nitride layer 33, and the silicon oxide layer 23. Typically, the barrier metal of the contact plugs 501 and 502 is in contact with the silicon oxide film 21 and the silicon nitride layer 32.

The silicon nitride layer 33 can have an antireflection function with respect to light incident on the photoelectric conversion portion 11. The antireflection function can be further enhanced by stacking the silicon nitride layers 33 and 31 via the silicon oxide film 21 to cause multiple reflection. A portion of the silicon nitride layer 33 covering semiconductor regions other than the photoelectric conversion portion 11 can have a function of protecting the semiconductor substrate 10 from contamination and damage. Since the silicon nitride layer 31 is not provided on the semiconductor regions other than the photoelectric conversion portion 11, the silicon nitride layer 33 plays a part of the role of the silicon nitride layer 31 on the photoelectric conversion portion 11. The silicon oxide layer 23 can function as a buffer layer for preventing the silicon nitride layer 33 from contact with the semiconductor substrate 10. The separation of the silicon nitride layer 33 from the semiconductor substrate 10 can suppress the occurrence of dark current. A distance D3 between the silicon nitride layer 33 and the semiconductor substrate 10 is desirably greater than the distance between the silicon nitride layer 32 and the metal containing portions 163 and 173. In the present example, the gate insulation film 24 extends from between the semiconductor substrate 10 and the gate electrodes 42 and 43 to the semiconductor regions not covered by the gate electrodes 42 and 43. The distance D3 between the silicon nitride layer 33 and the semiconductor substrate 10 is thus equal to the sum of the thickness of the silicon oxide layer 23 and the thickness of the gate insulation film 24.

If the dielectric region 61 is made of silicon nitride, the silicon nitride layer 31 and the dielectric region 61 are made of the same material. With such a configuration, reflection is less likely to occur at the interface between the silicon nitride layer 31 and the dielectric region 61, and the light use efficiency improves.

The silicon oxide layer 23, the silicon nitride layer 33, the silicon oxide layer 22, the silicon oxide film 21, and the silicon nitride layer 31 on the photoelectric conversion portion 11 function as an antireflection layer with respect to light to be incident on the semiconductor substrate 10. The distance D2 between the silicon nitride layers 31 and 33 is important for the performance of this multilayered antireflection layer. The reason is that the silicon nitride layers 33 and 31 cause multiple reflection, which provides a function of reducing reflection by interference with the multiple reflection light. To control the distance D2, the total thickness of the silicon oxide layer 22 and the silicon oxide film 21 is controlled. The distance D2 between the silicon nitride layers 31 and 33 can be $\lambda/8n$ to $4\lambda/8n$ ($\lambda$ is the wavelength of the incident light (400 nm$\geq\lambda$800 nm), and n is the refractive index of silicon oxide (n$\approx$1.5)). For example, the distance D2 is 50 to 150 nm. To improve sensitivity and prevent stray light, the length L3 is desirably less than the maximum value of $\lambda$, i.e., less than 800 nm.

For example, the thickness of the silicon oxide layer 23 is 5 to 20 nm. For example, the thickness T33 of the silicon nitride layer 33 is 20 to 100 nm. For example, the thickness of the silicon oxide layer 22 is 10 to 100 nm. For example, the thickness of the silicon oxide film 21 is 20 to 200 nm. For example, the thickness of the silicon nitride layer 31 is 20 to 100 nm. The thickness of the silicon oxide film 21 can be greater than that of the silicon oxide layer 22.

In summary, a suitable relationship about the dimensions and distances of the foregoing layers, films, and other members to obtain an effect for improving the performance and reliability of the photoelectric conversion apparatus APR is D3<T312<T32≤T33<T311<T21<D2<D1<T42<L4<D5<L3. In addition, T21<100 nm, L4>200 nm, and L3<800 nm. All the dimensions and distances do not need to satisfy the relationship. It can be sufficient that a combination of at least two of the dimensions and distances satisfies the relationship of magnitude defined here.

Figure 4A:
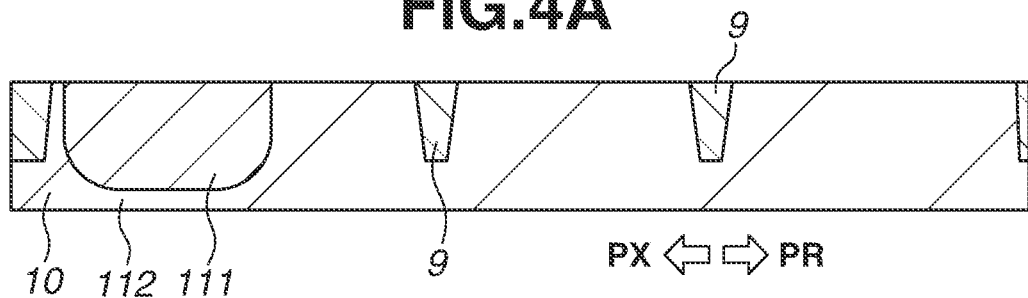
FIGS. 4A, 4B, 4C, and 4D are schematic diagrams for describing a manufacturing method of the photoelectric conversion apparatus.

A method for manufacturing the photoelectric conversion apparatuses APR will be described with reference to FIGS. 4A to 8Q2. FIGS. 4A to 8Q2 are diagrams each illustrating the structure of portions corresponding to the sectional view illustrated in FIG. 3 in step order. The step order does not need to be the same as that illustrated in FIGS. 4A to 8Q2. In FIGS. 4A to 8Q2, reference numerals of portions that may be unchanged from already described ones will be omitted.

In a step illustrated in FIG. 4A, a semiconductor substrate 10 including an element region defined by element isolation regions 9 is provided. The element isolation regions 9 have a local oxidation of silicon (LOCOS) structure or a shallow trench isolation (STI) structure, and can be formed by a conventional method. A p-type semiconductor region 112 serving as a well region and an n-type semiconductor region 111 are formed in the element region of the semiconductor substrate 10.

Figure 4B:
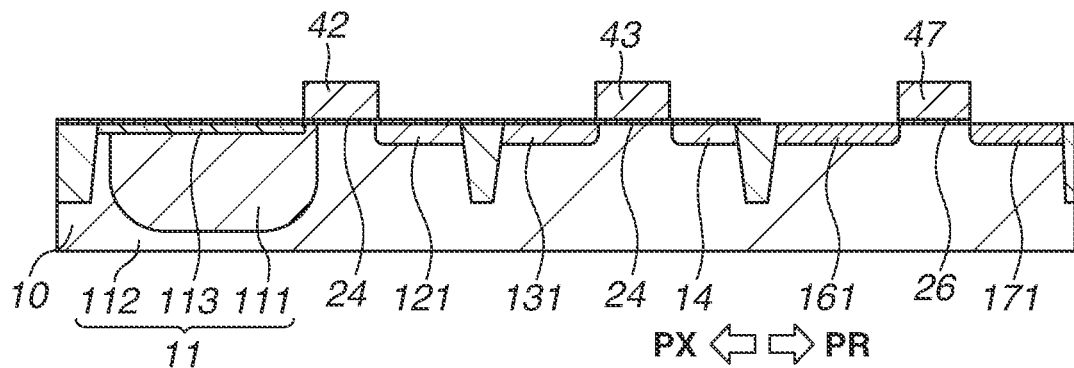

In a step illustrated in FIG. 4B, gate electrodes 42, 43, and 47 are formed on the semiconductor substrate 10. Gate insulation films 24 and 26 are initially formed on the semiconductor substrate 10, and then a conductor film made of polysilicon is formed on the gate insulation films 24 and 26. The gate electrodes 42, 43, and 47 are formed by patterning the conductor film. Semiconductor regions 113, 121, 131, 14, 161, and 171 are further formed by ion implantation. The semiconductor region 111 can be formed after the formation of the gate electrode 42.

Figure 4C:
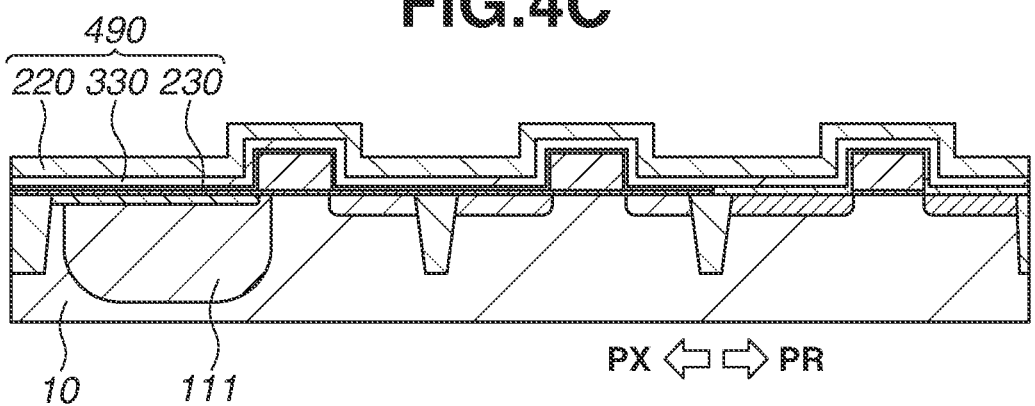

In a step illustrated in FIG. 4C, an insulator film 490 is formed to cover the photoelectric conversion portion 11. The insulator film 490 is a multilayer film including a silicon oxide layer 220, a silicon nitride layer 330 between the silicon oxide layer 220 and the semiconductor substrate 10, and a silicon oxide layer 230 between the silicon nitride layer 330 and the semiconductor substrate 10. The insulator film 490 is formed by stacking the silicon oxide layer 230, the silicon nitride layer 330, and the silicon oxide layer 220 in this order from the side of the semiconductor substrate 10. Each layer of the insulator film 490 can be formed by thermal chemical vapor deposition (CVD), such as low pressure (LP)-CVD.

Figure 4D:
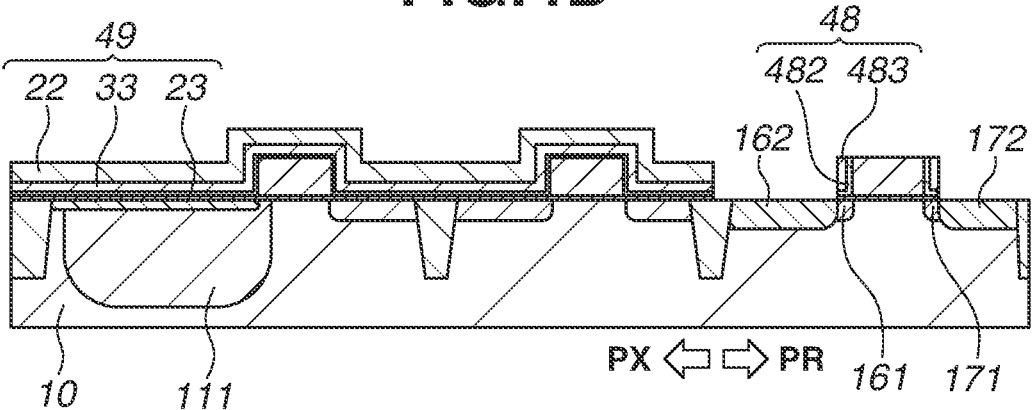

In a step illustrated in FIG. 4D, a sidewall spacer 48 is formed from the insulator film 490. The sidewall spacer 48 can be formed by masking the insulator film 490 with a resist pattern in the pixel area PX, and anisotropically etching the insulator film 490 in the peripheral area PR. The silicon nitride layer 483 of the sidewall spacer 48 is formed from the silicon nitride layer 330 of the insulator film 490. The silicon oxide layer 482 of the sidewall spacer 48 is formed from the silicon oxide layer 230 of the insulator film 490. The sidewall spacer 48 can include a silicon oxide layer (not illustrated) formed from the silicon oxide layer 220.

The portion of the insulator film 490 within the pixel area PX remains as an insulator film 49. The silicon oxide layer 22 of the insulator film 49 is formed from the silicon oxide layer 220 of the insulator film 490. The silicon nitride layer 33 of the insulator film 49 is formed from the silicon nitride layer 330 of the insulator film 490. The silicon oxide layer 23 of the insulator film 49 is formed from the silicon oxide layer 230 of the insulator film 490.

In a step illustrated in FIG. 4D, an intermediately doped semiconductor region 162 of a source 16 and an intermediately doped semiconductor region 172 of a drain 17 are further formed by using the sidewall spacer 48 as a mask.

Figure 5E:
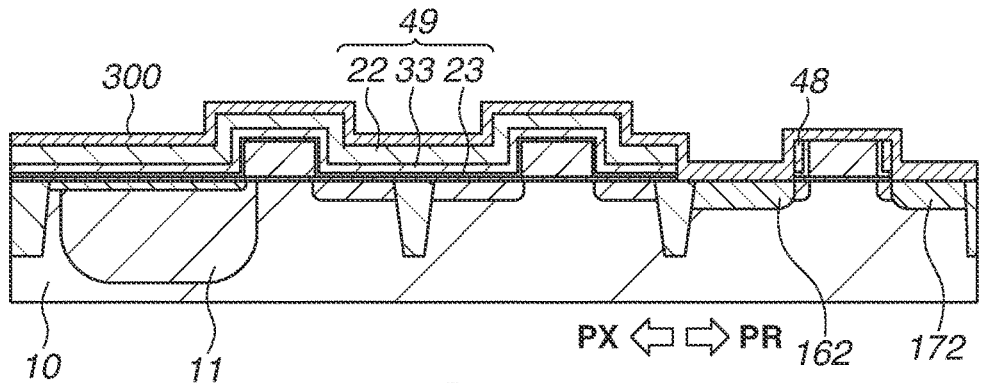
FIGS. 5E, 5F, 5G, and 5H are schematic diagrams for describing the manufacturing method of the photoelectric conversion apparatus.

In a step illustrated in FIG. 5E, a metal film 300 is formed in contact with a portion of the insulator film 49 lying on the photoelectric conversion portion 11 and the semiconductor substrate 10. The metal film 300 is desirably in contact with the silicon oxide layer 22 of the insulator film 49. In other words, at the stage of forming the metal film 300, the silicon oxide layer 22 is desirably left on the silicon nitride layer 33 of the insulator film 49. The metal film 300 can also be in contact with the gate electrode 47. Examples of the metal film 300 include a cobalt film, a nickel film, a tungsten film, and a titanium film. The metal film 300 can be formed to cover the semiconductor regions 162 and 172 and the gate electrode 47 in the peripheral area PR, for example, by spattering.

In the peripheral area PR, the semiconductor regions 162 and 172 of the semiconductor substrate 10 and the gate electrode 47 need to be exposed. The semiconductor regions 162 and 172 and the gate electrode 47 can therefore react with oxygen in the atmosphere to form a natural oxide film on the surfaces. Part of the insulator film 490 or the gate insulation film 26 may remain on the surfaces of the semiconductor regions 162 and 172 and the gate electrode 47. If there is a natural oxide film or insulator film between the metal film 300 formed thereon and silicon, reaction by thermal treatment can be hindered to cause a formation failure of the metal containing portions 163, 173, and 473. To avoid this, the natural oxide film and the insulator film are removed by etching immediate before the formation of the metal film 300. For example, the etching can be performed by wet etching using a solution containing a hydrofluoric acid.

By the etching of the natural oxide film and the insulator film, a portion of the insulator film 49 which lies under the natural oxide film and the insulator film and lies on the photoelectric conversion portion 11 can be thinned. Specifically, the silicon oxide layer 22 of the insulator film 49 is thinned by the etching.

Figure 5F:
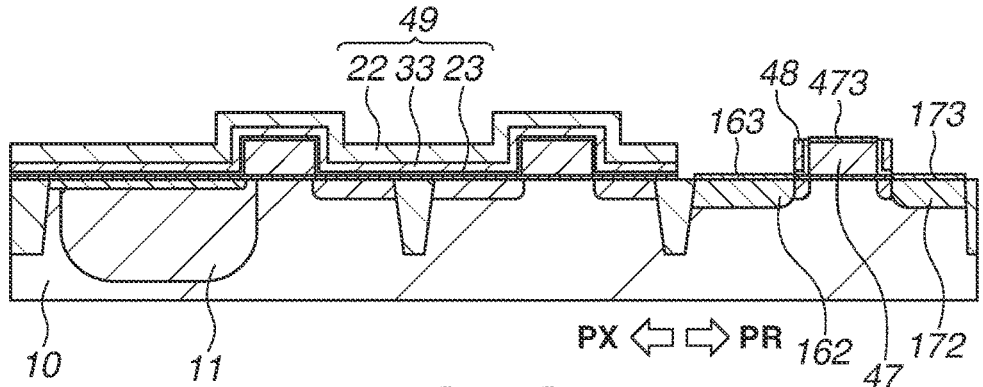

In a step illustrated in FIG. 5F, the metal containing portions 163, 173, and 473 are formed on the semiconductor substrate 10 by using the metal film 300. After the formation of the metal film 300, heat treatment is performed so that the metal of the metal film 300, the silicon (monocrystalline silicon) of the semiconductor substrate 10, and the silicon (polycrystalline silicon) of the gate electrode 47 react with each other. As a result, the metal containing portions 163, 173, and 473 made of silicide, which is a compound of metal and silicon, are formed. Depending on the metal type of the metal film 300, the metal containing portions 163, 173, and 473 can be cobalt silicide, nickel silicide, tungsten silicide, or titanium silicide. In the pixel area PX, no silicide is formed since the semiconductor substrate 10 is covered by the silicon nitride layer 33 and the silicon oxide layer 22. Such a configuration can reduce the diffusion of metal such as cobalt and nickel, and reduce a leak current in the photoelectric conversion portion 11 and noise (white flaw) in the photoelectric conversion portion 11. Metal containing portions can be provided on an arbitrary configuration of the pixel area PX. Metal containing portions can be omitted from an arbitrary configuration of the peripheral area PR.

After the formation of the metal containing portions 163, 173, and 473, unreacted metal of the metal film 300 is removed by etching.

By the etching of the metal film 300, a portion of the insulator film 49 which lies under the metal film 300 and lies on the photoelectric conversion portion 11 can be thinned. Specifically, the silicon oxide layer 22 of the insulator film 49 is thinned by the etching.

The residue of the silicon oxide layer 220 remaining on the sidewall spacer 48 formed in the step illustrated in FIG. 4D can be removed by the foregoing etching of the natural oxide film and the insulator film or the etching of the metal film 300.

Figure 5G:
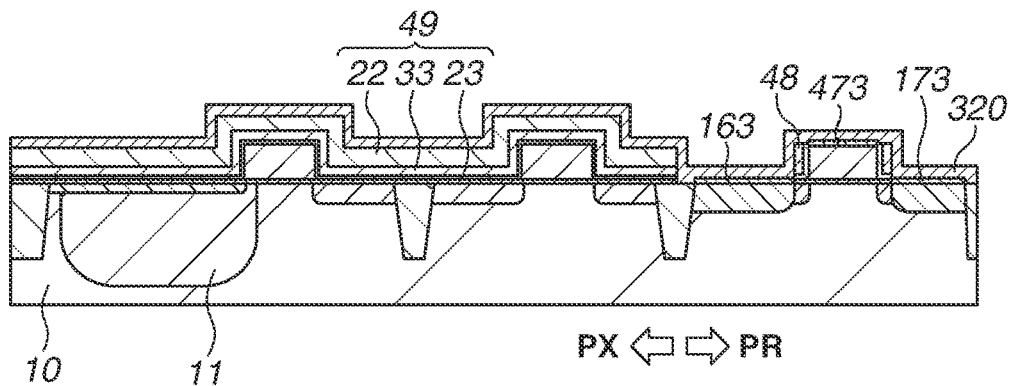

In a step illustrated in FIG. 5G, a silicon nitride film 320 is formed to cover the metal containing portions 163, 173, and 473 on the semiconductor substrate 10. The silicon nitride film 320 is formed over the pixel area PX and the peripheral area PR. For example, the silicon nitride film 320 can be formed by plasma CVD.

Figure 5H:
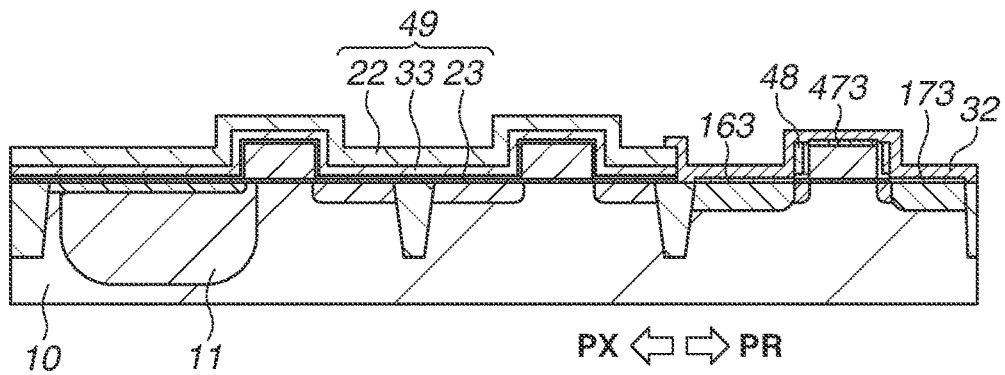

In a step illustrated in FIG. 5H, the silicon nitride film 320 on the photoelectric conversion portion 11 is removed. The portion of the silicon nitride film 320 lying on the peripheral transistor remains as a silicon nitride layer 32.

By the etching of the silicon nitride film 320, the portion of the insulator film 49 which lies under the silicon nitride film 320 and lies on the photoelectric conversion portion 11 can be thinned. Specifically, the silicon oxide layer 22 of the insulator film 49 is thinned by the etching.

Figure 6I:
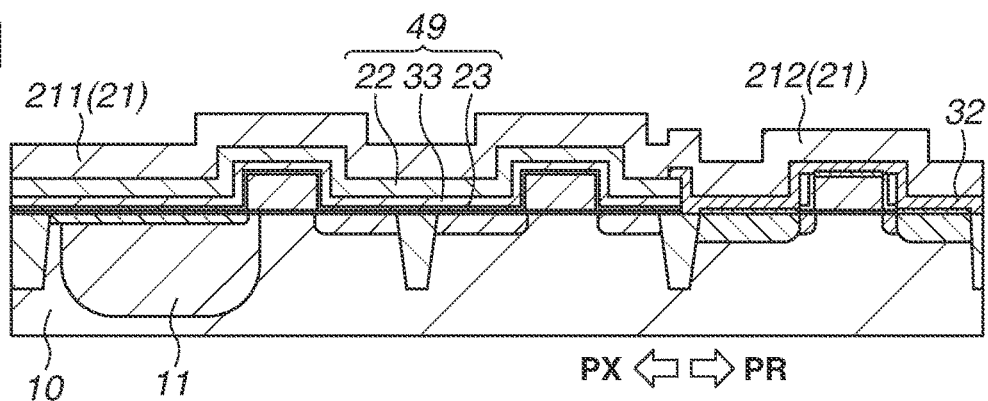
FIGS. 6I, 6J, 6K, and 6L are schematic diagrams for describing the manufacturing method of the photoelectric conversion apparatus.

In a step illustrated in FIG. 6I, a silicon oxide film 21 is formed on the silicon nitride film 320 (silicon nitride layer 32) to cover the photoelectric conversion portion 11 provided in the semiconductor substrate 10. The silicon oxide film 21 is formed over the pixel area PX and the peripheral area PR. For example, the silicon oxide film 21 can be formed by plasma CVD.

As described above, the distance between the silicon nitride layer 31 and the semiconductor 10 and the distance between the silicon nitride layer 31 and the silicon nitride layer 33 above the photoelectric conversion portion affect the reflectance. In the present exemplary embodiment, the optical characteristics can be optimized by forming the silicon oxide film 21 with an appropriate thickness. The thickness of the silicon oxide film 21 can be set according to the thickness of the silicon oxide layer 22 that is thinned in several steps. The amount of decrease in the thickness of the silicon oxide layer 22 can be found out in advance, and the thickness of the silicon oxide film 21 can be determined according to the amount of decrease. Alternatively, the thickness of the silicon oxide layer 22 is measured during manufacturing, and the thickness of the silicon oxide film 21 can be determined according to the measurement result. For example, if the thickness of the silicon oxide film 21 needs to be greater than the final thickness of the silicon oxide layer 22 remaining, the formation of the silicon oxide film 21 is extremely effective. For example, the thickness of the silicon oxide layer 22 which has been thinned is 10 to 100 nm. For example, the thickness of the silicon oxide film 21 is 20 to 200 nm.

Figure 6J:
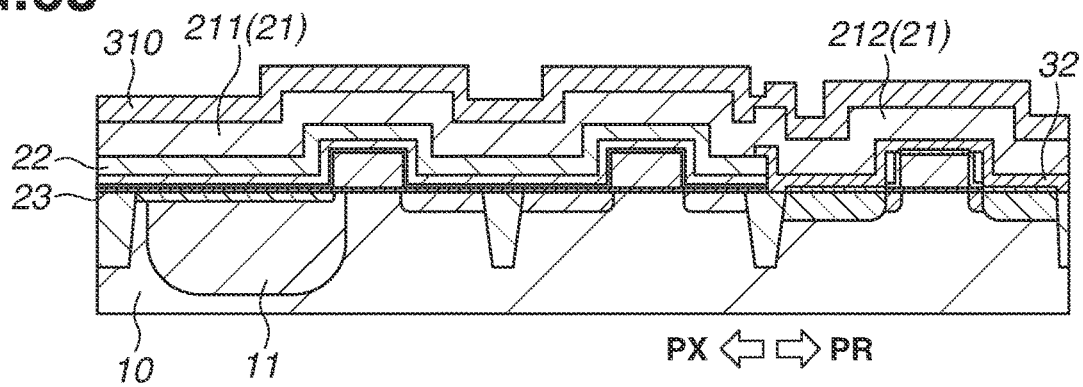

In a step illustrated in FIG. 6J, a silicon nitride film 310 is formed on the silicon oxide film 21 to cover the photoelectric conversion portion 11 provided in the semiconductor substrate 10. The silicon nitride film 310 is formed over the pixel area PX and the peripheral area PR. For example, the silicon nitride film 310 can be formed by plasma CVD. The thickness of the silicon nitride film 310 is desirably greater than that of the silicon nitride film 320 (silicon nitride layer 32).

Figure 6K:
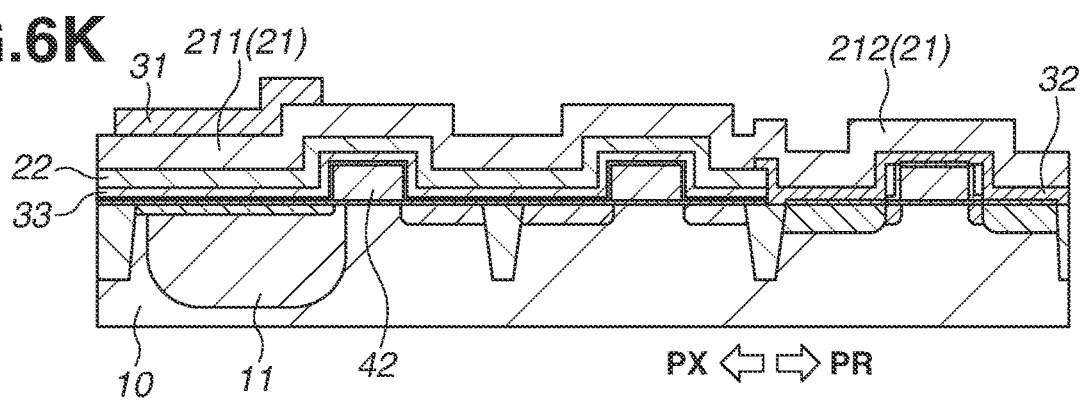

In a step illustrated in FIG. 6K, the silicon nitride film 310 on the pixel transistor is removed. A portion of the silicon nitride film 310 lying over the photoelectric conversion portion 11 remains as a silicon nitride layer 31. The silicon nitride film 310 can be patterned into the silicon nitride layer 31 of desired shape by a lithographic technique and an etching technique. The silicon nitride layer 31 is provided to extend over the n-type semiconductor region 111, or more specifically, from above the photoelectric conversion portion 11 to part of the gate electrodes 42 of the transfer gates TX1 and TX2. The top surface of the silicon nitride layer 31 has a shape in accordance with a difference in level due to the gate electrodes 42. In the region of the pixel area PX where the contact plugs 501 and 502 are arranged, the silicon nitride film 310 is desirably removed by etching.

Figure 6L:
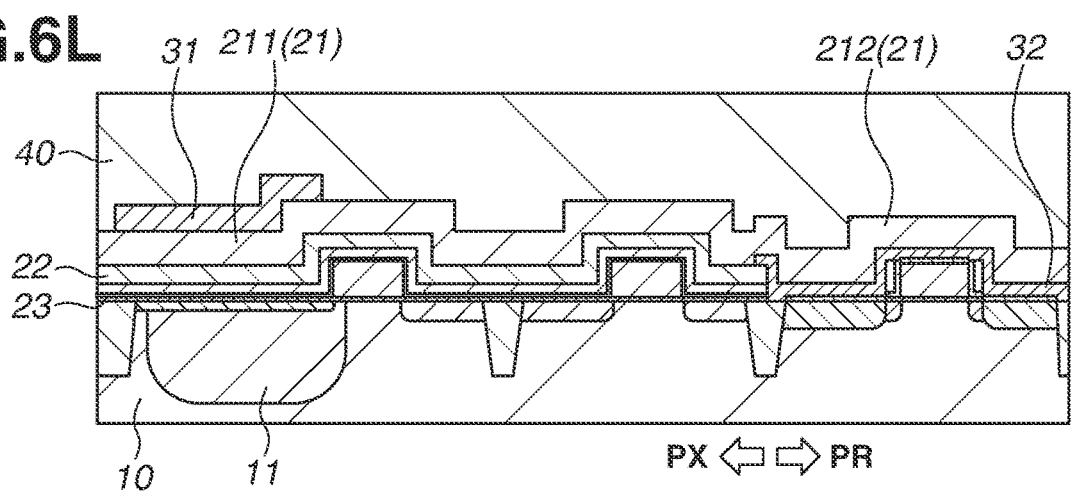

In a step illustrated in FIG. 6L, an interlayer insulation film 40 is formed. The interlayer insulation film 40 is formed to cover a portion (silicon nitride layer 32) of the silicon nitride film 320 lying on the peripheral transistor including the gate electrode 47 and a portion (silicon nitride layer 31) of the silicon nitride film 310 lying over the photoelectric conversion portion 11. The interlayer insulation film 40 is planarized by using a planarization method, such as a reflow method, an etch-back method, and chemical mechanical polishing (CMP).

Figure 7M:
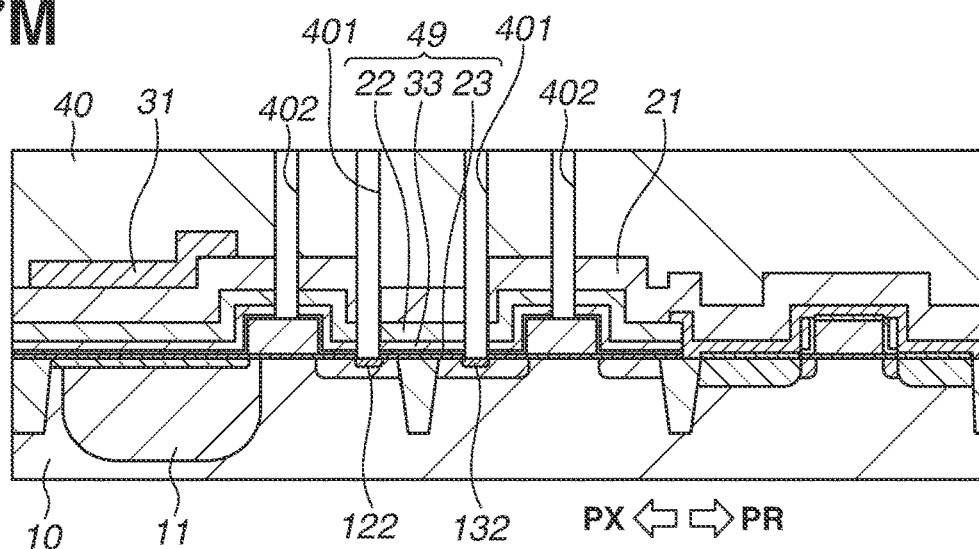
FIGS. 7M, 7N, and 7O are schematic diagrams for describing the manufacturing method of the photoelectric conversion apparatus.

In a step illustrated in FIG. 7M, contact holes 401 and 402 are formed in the interlayer insulation film 40, the silicon oxide film 21, and the insulator film 49 so as to be located above the pixel transistor. The contact holes 401 and 402 are holes formed in at least the interlayer insulation film 40.

To form the contact holes 401 and 402 in the pixel area PX, the interlayer insulation film 40, the silicon oxide film 21, the silicon oxide layer 22, the silicon nitride layer 33, and the silicon oxide layer 23 are successively etched by plasma etching. Here, the silicon nitride layer 33 can function as an etching stopper. More specifically, the etching condition in etching the silicon oxide layer 22 is that the etching rate to the silicon nitride layer 33 is lower than that to the silicon oxide layer 22. If there is no silicon oxide layer 22 in the pixel area PX, the silicon oxide film 21 can be considered as an equivalent for the silicon oxide layer 22.

The silicon nitride layer 33 serving as the etching stopper cancels variations in the depth of the contact holes 401 and 402 in etching the layers above the silicon nitride layer 33. Damage to the semiconductor substrate 10 can be suppressed by etching the thin silicon nitride layer 33 close to the semiconductor substrate 10 in the state where variations in the depth of the contact holes 401 and 402 are reduced. While the silicon nitride layer 33 is desirably located close to the semiconductor substrate 10, the silicon oxide layer 23 is arranged between the silicon nitride layer 33 and the semiconductor substrate 10 since contact between the silicon nitride layer 33 and the semiconductor substrate 10 easily causes noise.

If a step illustrated in FIG. 5H is not performed, there is the silicon nitride film 320 arranged on the pixel transistor. To form the contact holes 401 and 402, the interlayer insulation film 40, the silicon oxide film 21, the silicon nitride film 320, the silicon oxide layer 22, the silicon nitride layer 33, and the silicon oxide layer 23 are then etched in this order. In such a case, the presence of the silicon nitride film 320 complicates the changing of etching conditions and an etching stop condition, with a possible drop in yield. By contrast, the number of times of changing of conditions in etching the silicon nitride layer can be reduced (to one) by removing the silicon nitride film 320 on the pixel transistor in the step illustrated in FIG. 5H. This facilitates the formation of the contact holes 401 and 402, reduces variations, and improves the yield.

Similarly, if the step illustrated in FIG. 6K is not performed, there is the silicon nitride film 310 arranged on the pixel transistor. To form the contact holes 401 and 402, the interlayer insulation film 40, the silicon nitride film 310, the silicon oxide film 21, the silicon oxide layer 22, the silicon nitride layer 33, and the silicon oxide layer 23 are then etched in this order. In such a case, the presence of the silicon nitride film 310 completes the changing of etching conditions and the etching stop condition, with a possible drop in yield. By contract, the number of times of changing of conditions in etching the silicon nitride layer 31 can be reduced (to one) by removing the silicon nitride film 310 on the pixel transistor in the step illustrated in FIG. 6K. This facilitates the formation of the contact holes 401 and 402, reduces variations, and improves the yield.

Semiconductor regions 122 and 132 serving as contact regions are formed by ion implantation into the semiconductor substrate 10 via the contact holes 401. In forming the semiconductor regions 122 and 132, impurities is prevented from being injected into the channel regions through the gate electrodes 42 and 43 by covering the contact holes 401 with a resist mask.

Figure 7N:
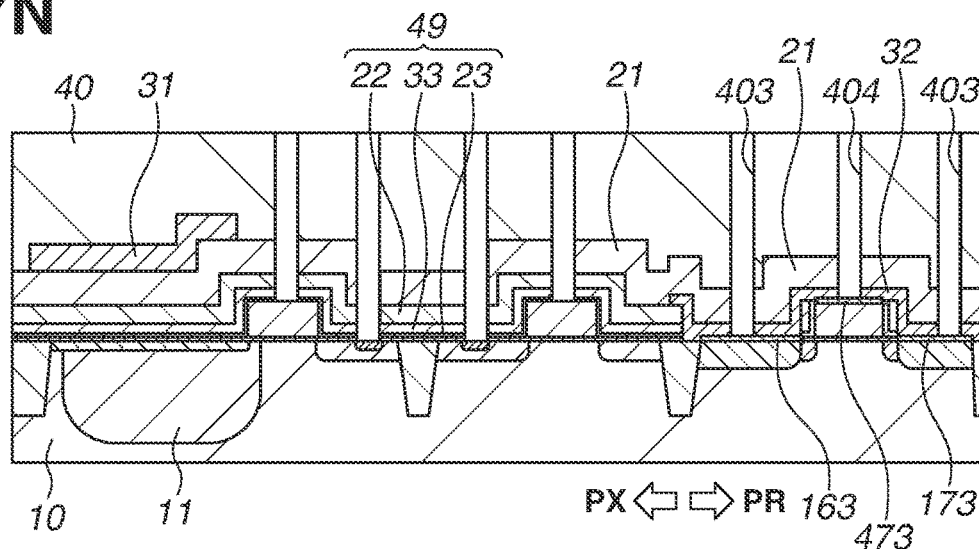

In a step illustrated in FIG. 7N, contact holes 403 and 404 are formed in the interlayer insulation film 40, the silicon oxide film 21, and the silicon nitride film 320 (silicon nitride layer 32) so as to be located above the peripheral transistor. The contact holes 403 and 404 are holes provided at least in the interlayer insulation film 40.

To form the contact holes 403 and 404 in the peripheral area PR, the interlayer insulation film 40, the silicon oxide film 21, and the silicon nitride layer 32 are successively etched by plasma etching. Here, the silicon nitride layer 32 can function as an etching stopper. More specifically, the etching condition in etching the silicon oxide film 21 is that the etching rate to the silicon nitride layer 32 is lower than that to the silicon oxide film 21. If there is no silicon oxide film 21 in the peripheral area PR, the interlayer insulation film 40 can be considered as an equivalent for the silicon oxide film 21.

The silicon nitride layer 32 serving as the etching stopper cancels variations in the depth of the contact holes 403 and 404 in etching the layers above the silicon nitride layer 32. The silicon nitride layer 32 which is thin and is close to the semiconductor substrate 10 is then etched in the state where variations in the depth of the contact holes 403 and 404 are reduced. This can reduce damage to the semiconductor substrate 10 and suppress scattering of metal from the metal containing portions 163, 173, and 473. The silicon nitride layer 32 is desirably as close to the metal containing portions 163, 173, and 473 as possible. The silicon nitride layer 32 is desirably in contact with the metal containing portions 163, 173, and 473. The silicon nitride layer 32 is desirably as thin as possible.

If the step illustrated in FIG. 6K is not performed, there is the silicon nitride film 310 arranged on the peripheral transistor. To form the contact holes 403 and 404, the interlayer insulation film 40, the silicon nitride film 310, the silicon oxide film 21, and the silicon nitride layer 32 are then etched in this order. In such a case, the presence of the silicon nitride film 310 complicates the changing of etching conditions and an etching stop condition, with a possible drop in yield. By contrast, the number of times of changing of conditions in etching the silicon nitride layer can be reduced (to one) by removing the silicon nitride film 310 on the peripheral transistor in the step illustrated in FIG. 6K. This facilities the formation of the contact holes 403 and 404, reduces variations, and improves the yield.

Figure 7O:
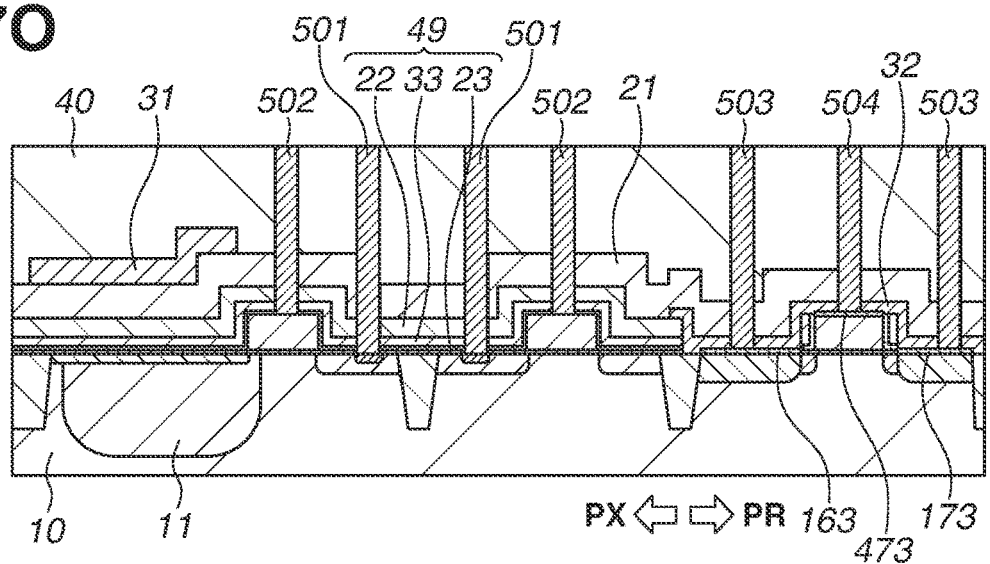

In a step illustrated in FIG. 7O, conductors are arranged in the contact holes 401, 402, 403, and 404. The conductors can be a stacked member of barrier metal and tungsten. Contact plugs 501, 502, 503, and 504 are formed by removing excessive conductors on the interlayer insulation film 40 by CMP.

Like the steps illustrated in FIGS. 7M and 7N, the contact holes 401 and 402 and the contact holes 403 and 404 are desirably separately formed. The metal containing portions 163, 173, and 473 are formed in at least part of the peripheral area PR. The contact holes 403 and 404 expose the metal containing portions 163, 173, and 473. In such a case, the metal of the metal containing portions 163, 173, and 473 can be scattered by the etching during the formation of the contact holes 403 and 404 in the peripheral area PR. In forming the contact holes 403 and 404, the contact holes 401 and 402 are therefore desirably in any of the states of not being formed yet, being covered with a resist mask, and being already filled with the contact plugs 501 and 502. In the present example, the contact holes 401 and 402 are formed before the formation of the contact holes 403 and 404, and the contact holes 403 and 404 are formed in the state where the contact holes 401 and 402 are covered with a resist mask. The resist mask can suppress the intrusion of the metal of the metal containing portions 163, 173, and 473 into the contact holes 401 and 402.

If the scattering of the metal of the metal containing portions 163, 173, and 473 does not have much effect, the contact holes 401 and 402 and the contact holes 403 and 404 can be simultaneously formed. In such a case, for example, a difference in thickness between the silicon nitride layers 33 and 32 is desirably small. For example, the difference in thickness between the silicon nitride layers 33 and 32 is desirably 10 nm or less. If the silicon nitride layers 33 and 32 are equivalent in thicknesses, the contact holes 401 and 402 in the pixel area PX and the contact holes 403 and 404 in the peripheral area PR can be simultaneously formed. However, if the difference in thickness between the silicon nitride layers 33 and 32 is 10 nm or less, separate steps such as the steps illustrated in FIGS. 7M and 7N are desirably used. In particular, if the distance between the silicon nitride layer 33 and the semiconductor substrate 10 is different from that between the silicon nitride layer 32 and the metal containing portions 163 and 173, separate steps such as the steps illustrated in FIGS. 7M and 7N are desirably used.

The steps illustrated in FIGS. 7M and 7N can be performed in reverse order. In the present example, the step illustrated in FIG. 7O is performed after the steps illustrated in FIGS. 7M and 7N. However, for example, the contact holes 403 and 404 can be formed after conductors are arranged in the contact holes 401 and 402 to form the contact plugs 501 and 502. The contact holes 401 and 402 can be formed after conductors are arranged in the contact holes 403 and 404 to form the contact plugs 503 and 504.

In the next step, as illustrated in FIG. 8Q1 corresponding to FIG. 2B, an interlayer insulation film 50 and a plurality of wiring layers 51, 52, and 53 are formed on the interlayer insulation film 40. The wiring layers 51, 52, and 53 are copper layers. The wiring layer 51 can be formed by single damascening. The wiring layers 52 and 53 can be formed by dual damascening. The interlayer insulation layers 56 are silicon oxide layers having a thickness of 100 nm to 1000 nm. The diffusion prevention layers 57 are silicon carbide layers having a thickness of 10 to 100 nm. The interlayer insulation layers 56 and the diffusion prevention layers 57 can be formed by plasma CVD. The interlayer insulation layers 56 can be formed by plasma CVD using a silane gas as a material gas.

In the step illustrated in FIG. 8P1 corresponding to FIG. 2B and the step illustrated in FIG. 8P2 corresponding to FIG. 3, a resist pattern having an opening corresponding to the photoelectric conversion portion 11 is formed on the interlayer insulation film 50. The interlayer insulation film 50 is then etched by using the resist pattern as a mask. The interlayer insulation film 40 is further etched to form an opening 406 with the silicon nitride film 310 (silicon nitride layer 31) at the bottom. When the interlayer insulation film 40 is etched, the silicon nitride layer 31 can function as an etching stopper. More specifically, the etching condition in etching the interlayer insulation film 40 is that the etching rate to the silicon nitride layer 31 is lower than that to the interlayer insulation film 40.

The silicon nitride layer 31 can be etched by the etching during the formation of the opening 406. As a result of the etching, a portion of the silicon nitride layer 31 under the opening 406 decreases in thickness from the thickness T311 to the thickness T312. The portions 311 and 312 are thereby formed. The thickness T312 may be 25% to 75% of the thickness T311. The possibility that the opening 406 goes through the silicon nitride layer 31 during the formation of the opening 406 can be reduced by making the silicon nitride layer 31 sufficiently thick. The silicon nitride layer 31 can function to reduce plasma damage to the photoelectric conversion portion 11 during the etching for forming the opening 406. The effect that the silicon nitride layer 31 reduces plasma damage during the formation of the opening 406 can also be made effective by making silicon nitride layer 31 sufficiently thick.

In the step illustrated in FIG. 8Q1 corresponding to FIG. 2B and the step illustrated in FIG. 8Q2 corresponding to FIG. 3, a dielectric member 60 including a dielectric region 61 is formed by arranging a dielectric in the opening 406 as illustrated in FIG. 3. An optical waveguide in which the dielectric region 61 serves as a core and the plurality of interlayer insulation layers 56 serves as a clad is constituted by arranging a dielectric having a refractive index higher than that of the plurality of interlayer insulation layers 56, such as silicon nitride, in the opening 406. The dielectric arranged in the opening 406 does not need to have a refractive index higher than that of the plurality of interlayer insulation layer 56. Examples of such a dielectric can include silicon oxide. The thickness of the silicon nitride layer 31 changes due to the etching during the formation of the opening 406 in the interlayer insulation film 40. Even in such a case, the use of silicon nitride for the dielectric region 61 reduces impact on the optical characteristics at the position of the interface between the silicon nitride layer 31 and the dielectric region 61.

A detailed example of a method for forming the dielectric member 60 will be described. Initially, the opening 406 is filled up by using silicon nitride having a refractive index higher than that of silicon oxide which is a main material constituting the plurality of interlayer insulation layers 56. Specifically, silicon nitride is deposited on the entire surface of the semiconductor substrate 10 by high density plasma (HDP)-CVD, whereby the opening 406 is filled with the silicon nitride. Again, the silicon nitride layer 31 can function to reduce plasma damage to the photoelectric conversion portion 11 when the dielectric is deposited by the plasma CVD. The effect of reducing plasma damage during the filling of the opening 406 with the dielectric can also be made effective by making the silicon nitride layer 31 sufficiently thick. Excessive silicon nitride formed on the peripheral area PR is then removed by plasma etching. Silicon nitride lying on the interlayer insulation film 50 outside the opening 406 is further planarized by CMP. Here, the silicon nitride arranged on the interlayer insulation film 50 is not entirely removed but left as a dielectric film 62. The dielectric film 62 is a layer extending from above the dielectric region 61 to over the top surface of the interlayer insulation film 50. For example, the dielectric film 62 has a thickness of 100 nm to 500 nm. The purpose is to suppress damage to the wiring layers.

Next, in the peripheral area PR, the dielectric film 62 is removed by etching. Since the dielectric film 62 made of silicon nitride has high residual stress, warpage of the semiconductor substrate 10 and separation of the dielectric film 62 and the interlayer insulation film 50 can be reduced by reducing the area of the dielectric film 62.

In the next step, as illustrated in FIG. 2B, an interlayer insulation film 70 is formed to cover the dielectric film 62. For example, the interlayer insulation film 70 is made of silicon oxide. The interlayer insulation film 70 can be formed by plasma CVD using silane as a material gas.

In the next step, as illustrated in FIG. 2B, via holes are formed in the interlayer insulation film 70 in the peripheral area PR. Since the dielectric film 62 has been removed from the peripheral area PR, via holes running through the interlayer insulation films 70 and 50 to reach the wiring layer 53 can be formed easily. Via plugs 54 are formed in the via holes. A wiring layer 55 is formed on the interlayer insulation film 70. The wiring layer 55 can be made of an aluminum layer, and can be patterned to include pad electrodes and a light shielding pattern.

In the next step, as illustrated in FIG. 2B, a silicon nitride film is formed by plasma CVD. An inorganic material film 80 is formed such that this silicon nitride film includes an in-layer lens 81.

In the next step, as illustrated in FIG. 2B, an organic material film 90 including a planarization layer 91, a color filter layer 92, a planarization layer 93, and a microlens layer 94 is formed on the inorganic material film 80.

In the next step, the wafer is diced and divided into a plurality of semiconductor devices IC.

In the next step, a semiconductor device IC is mounted on a package PKG.

By such steps, a photoelectric conversion apparatus APR can be manufactured.

That the silicon oxide film 21 includes the portion 211 in the pixel area PX and the portion 212 in the peripheral area PR is advantageous in terms of improving reliability. The reason is that the inclusion of the portions 211 and 212 in the silicon oxide film 21 reduces differences in the height of the structures formed on the semiconductor substrate 10 between the pixel area PX and the peripheral area PR. The structures formed on the semiconductor substrate 10 include the gate electrodes 42 and 43, and the silicon nitride layers 31, 32, and 33. The pixel area PX includes the silicon nitride layer 31 in addition to the silicon oxide layer 22 and the silicon oxide film 21, and thus has a total height greater than that of the silicon nitride layer 32 and the like in the peripheral area PR. The difference in height affects a difference in the level of the top surface of the interlayer insulation film 40 formed on the structures. The interlayer insulation film 40 is planarized by CMP. If the top surface of the interlayer insulation film 40 here has a large difference in level, the difference in level fails to be canceled out and the top surface of the interlayer insulation film 40 is likely to include portions lying at large distances and ones lying at small distances from the semiconductor substrate 10. In other words, even after the planarization of the interlayer insulation film 40, the interlayer insulation film 40 can be high in the pixel area PX including high structures, and low in the peripheral area PR including low structures. Even within the pixel area PX, the closer to the peripheral area PR, the lower the interlayer insulation film 40 can be. With such a shape, there are differences in the thickness to be etched by the etching in forming the contact holes 401, 402, 403, and 404. This can result in the occurrence of opening failures and etching damage to the semiconductor substrate 10. In such a case, the contact plugs can be short-circuited, and image quality can drop. In addition, by damascening, metal may be left on an unintended area in the step of removing metal material during the formation of the contact plugs 501, 502, 503, and 504, and the wiring layer 51. In such a case, short-circuit failures of the contact plugs and wiring can occur.

In the manufacturing method described above, the step illustrated in FIG. 6J (and the step illustrated in FIG. 6K) may be performed after the step illustrated in FIG. 5G (and the step illustrated in FIG. 5H). The silicon nitride layer 31 (silicon nitride film 310) can then be made thicker than the silicon nitride layer 32 (silicon nitride film 320). However, the silicon nitride layer 31 (silicon nitride film 310) is desirably located away from the photoelectric conversion portion 11, and the silicon nitride layer 32 (silicon nitride film 320) is desirably located close to the metal containing portions 163, 173, and 473. The steps illustrated in FIGS. 5G and 5H are therefore desirably performed after the steps illustrated in FIGS. 6J and 6K.

At least any one of the steps illustrated in FIGS. 5H, 6I, and 6K may be omitted. However, in terms of facilitating the formation of the contact holes 401, 402, 403, and 404 as described above, the overlapping of the silicon nitride films 310 and 320 can be eliminated by performing the steps illustrated in FIGS. 5H and 6K. In terms of locating the silicon nitride layer 31 (silicon nitride film 310) away from the photoelectric conversion portion 11, the silicon oxide film 21 is desirably formed by performing the step illustrated in FIG. 6I. Performing the step illustrated in FIG. 6I is also desirable in terms of adjusting the distance between the silicon nitride layers 31 and 33 on the photoelectric conversion portion 11 for optimum optical characteristics.

The thickness, composition, film quality, film formation method, and/or film formation condition of the silicon nitride film 320 to be the silicon nitride layer 32 can be different from those of the silicon nitride film 310 to be the silicon nitride layer 31.

As described above, the silicon nitride layer 31 is desirably thick, and the silicon nitride layer 32 is desirably thin. In the present exemplary embodiment, the silicon nitride film 310 and the silicon nitride film 320 are formed in separate the steps illustrated in FIGS. 5G and 6J, and are therefore easy to optimize in thickness. A difference in thickness between the silicon nitride films 310 and 320 is desirably 5 nm or more. Both the silicon nitride films 310 and 320 can have a thickness of 10 to 100 nm. The difference in thickness between the silicon nitride films 310 and 320 can be 50 nm or less.

The silicon nitride films 310 and 320 can be different in composition. For example, the composition ratios of silicon (Si) and nitrogen (N) can be different. The concentrations of elements other than silicon (Si) or nitrogen (N), such as argon (Ar) and chlorine (Cl), can be different.

The silicon nitride films 310 and 320 can be different in film quality. The silicon nitride film 310 (silicon nitride layer 31) and the silicon nitride film 320 (silicon nitride layer 32) can have different residual stresses. The residual stress of the silicon nitride film 310 (silicon nitride layer 31) is desirably smaller than that of the silicon nitride film 320 (silicon nitride layer 32). The effect of the residual stress will be described. The silicon nitride layer 32 can apply compression or tension stress to the channel region of the semiconductor substrate 10 to cause distortion in the silicon crystal and improve the mobility of carriers passing through the silicon crystal. As the mobility of major carriers of a transistor improves, the driving performance improves. Whether to apply compression stress or tension stress, and the magnitude of the stress, can be arbitrarily selected according to the intended effect. The silicon nitride layer 32 can also improve the driving performance of the transistor. In the pixel area PX, if the silicon nitride film 310 has high residual compression or tension stress, film separation may occur because of adhesiveness to the silicon oxide layer 22. In the present exemplary embodiment, at least part of the silicon nitride film 310 in the pixel area PX can therefore be removed. For the same reason, the silicon nitride layer 31 formed in the pixel area PX is desirably small in residual stress. In other words, the silicon nitride layers 31 and 32 desirably have different residual stresses. The silicon nitride layers 31 and 32 are formed in respective different steps under different conditions. The residual stresses can thus be individually selected, and films having different residual stresses can be formed. Both the silicon nitride layers 31 and 32 are insulation films made of silicon nitride. For example, the silicon nitride layers 31 and 32 are deposited by plasma CVD. The residual stresses of the deposited films can be controlled by adjusting parameters such as the temperature and pressure of plasma. The residual stress of the silicon nitride layer 32 can be changed by adding a heat treatment step. In such a case, since only the silicon nitride layer 32 needs the heat treatment, the heat treatment can be performed before the deposition of the silicon nitride film 310. Since the silicon nitride layers 31 and 32 have different residual stresses, the driving capability of the transistors can be improved and film separation can be suppressed in a compatible manner. This can improve the performance of the photoelectric conversion apparatus APR.

The film formation methods of the silicon nitride films 310 and 320 can be different. For example, the silicon nitride film 320 can be formed by thermal CVD, and the silicon nitride film 310 by plasma CVD. Either one of the silicon nitride films 310 and 320 can be formed by using dichlorosilane (DCS) as a material gas. The other of the silicon nitride films 310 and 320 can be formed by using hexachlorodisilane (HCD) as a material gas.

The film formation conditions of the silicon nitride films 310 and 320 can be different. Either one of the silicon nitride films 310 and 320 can differ from the other in plasma power, gas flow rate, gas pressure, and/or film formation temperature.

Figure 9:
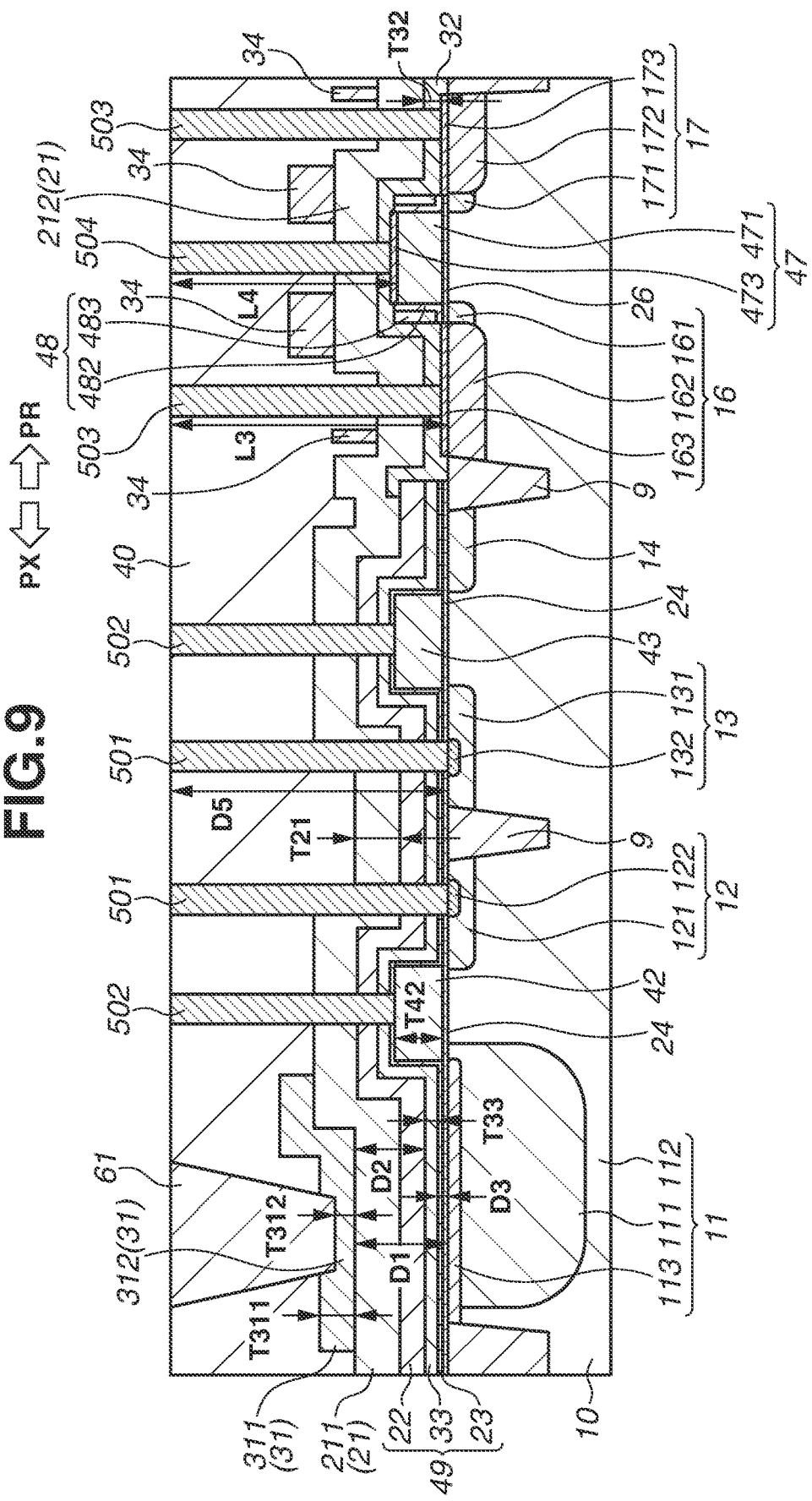
FIG. 9 is a schematic diagram for describing a structure of a photoelectric conversion apparatus.

FIG. 9 is a schematic sectional view of a photoelectric conversion apparatus APR according to a second exemplary embodiment. FIG. 9 illustrates a cross section of a portion corresponding to the schematic sectional view of FIG. 3. In FIG. 9, the wiring layer 51 illustrated in FIG. 3 is omitted.

In the present exemplary embodiment, like the silicon nitride layer 31 in the pixel area PX, a silicon nitride layer 34 is arranged between the interlayer insulation film 40 and the silicon oxide film 21 in the peripheral area PR. The contact plugs 503 and 504 do not penetrate through the silicon nitride layer 34. The interlayer insulation film 40 is interposed between the contact plugs 503 and 504 and the silicon nitride layer 34. The silicon nitride layer 34 is provided so that a difference in the level of the underlayer of the interlayer insulation film 40 due to the thickness of the silicon nitride layer 31 can be reduced. A difference in the level of the underlayer of the interlayer insulation film 40 due to the fact that the silicon nitride layer 31 is thicker than the silicon nitride layer 32 can also be reduced. A difference in the level of the underlayer of the interlayer insulation film 40 due to the thickness of the insulator film 49 can also be reduced.

In the present exemplary embodiment, the patterning of the silicon nitride film 310 is different from the step illustrated in FIG. 6J of the manufacturing method according to the first exemplary embodiment. In the first exemplary embodiment, after the formation of the silicon nitride film 310, the silicon nitride film 310 in the peripheral area PR is removed by etching. In the present exemplary embodiment, the silicon nitride film 310 is left at least in part of the peripheral area PR. During patterning, the silicon nitride film 310 is patterned so that a portion of the silicon nitride film 310 at an arbitrary position in the peripheral area PR is left as the silicon nitride layer 34. In other words, part of the silicon nitride film 310 lies between the silicon nitride film 320 and the interlayer insulation film 40. The silicon nitride layer 34 has a thickness equivalent to that of the silicon nitride layer 31. With errors taken into account, the thickness of the silicon nitride layer 34 is 95% to 105% of that of the silicon nitride layer 31.

In the present exemplary embodiment, the reliability of the photoelectric conversion apparatus APR can be improved for the same reason as that the silicon oxide film 21 includes the portion 211 in the pixel area PX and the portion 212 in the peripheral area PR according to the first exemplary embodiment. More specifically, the reason is that under the interlayer insulation film 40, a difference in level between the pixel area PX and the peripheral area PR at least due to the thickness of the silicon nitride film 310 can be reduced, and the flatness of the top surface of the interlayer insulation film 40 can be improved.

Here, the silicon nitride layer 34 is desirably located to avoid the positions where the contact plugs 501, 502, 503, and 504 are formed in subsequent steps. In other words, the silicon nitride layer 34 is provided away from the contact plugs 501, 502, 503, and 504. For that purpose, the silicon nitride film 310 can be patterned so that the silicon nitride layer 34 has openings corresponding to the contact plugs 503 and 504. The reason is that, as described in the steps illustrated in FIGS. 7M and 7N, if the formation of the contact holes 401, 402, 403, and 404 involves the etching of the silicon nitride film 310, the changing of the etching conditions and the setting of the etching stop condition become complicated. As described above, according to the present exemplary embodiment, the occurrence of failures can be suppressed and a drop in image quality can be suppressed by leaving at least part of the silicon nitride film 310 in the peripheral area PR.

Figure 10:
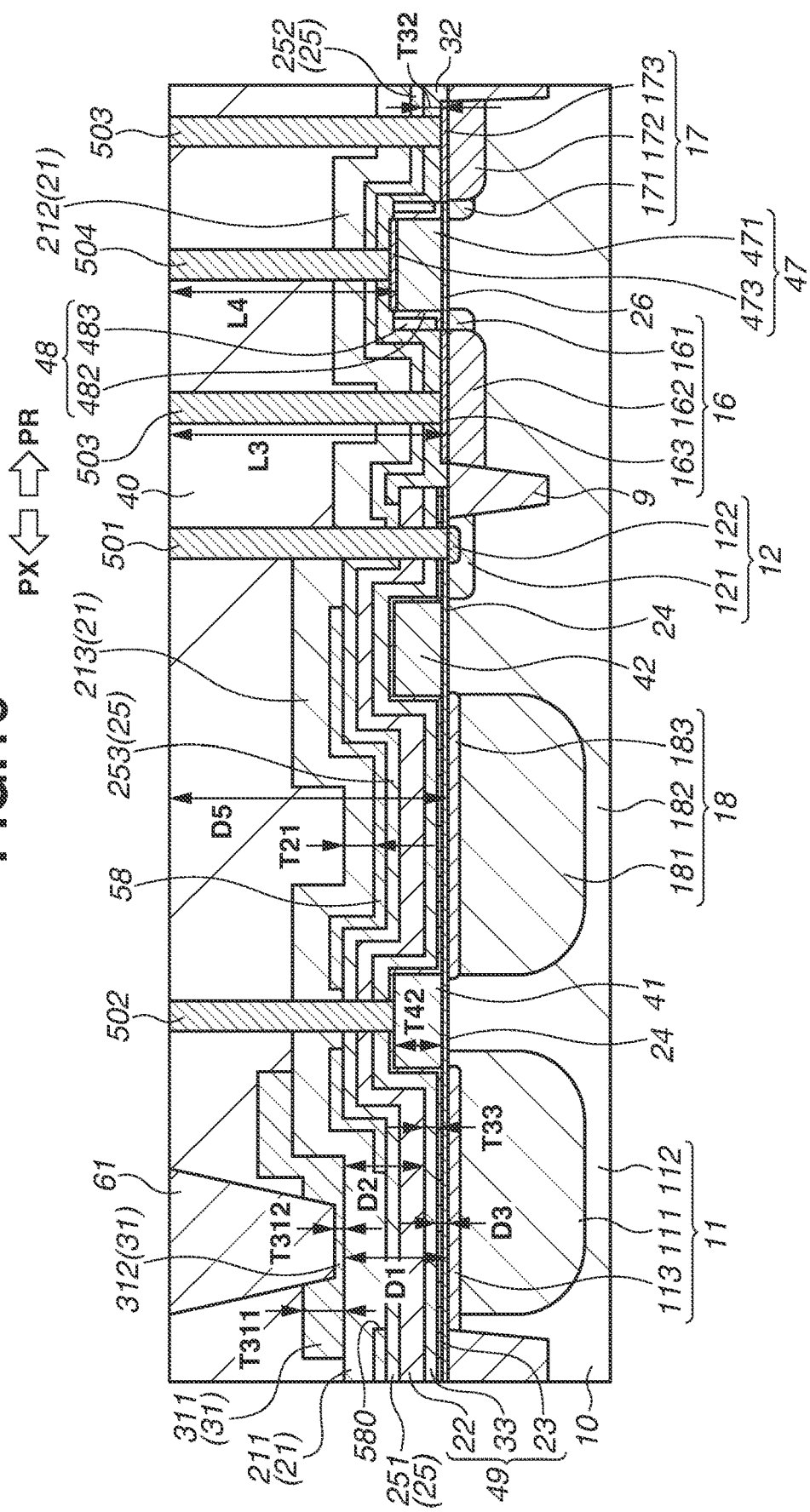
FIG. 10 is a schematic diagram for describing a structure of a photoelectric conversion apparatus.

FIG. 10 is a schematic sectional view of a photoelectric conversion apparatus APR according to a third exemplary embodiment. FIG. 10 illustrates a cross section of a portion corresponding to the schematic sectional view of FIG. 3. In FIG. 10, the wiring layer 51 illustrated in FIG. 3 is omitted.

In the present exemplary embodiment, the semiconductor substrate 10 includes, in the pixel area PX, a charge holding portion 18 for holding a charge generated by the photoelectric conversion portion 11. The charge generated by the photoelectric conversion portion 11 is transferred to the charge holding portion 18 by a transfer gate including a gate electrode 41. The charge held in the charge holding portion 18 is transferred to the charge detection portion 12 by the transfer gate including the gate electrode 42. The gate electrode 41 can be considered to have a thickness equal to that of the gate electrode 42. The thickness of the gate electrode 41 is thus represented by T42. The charge holding portion 18 includes an n-type semiconductor region 181 serving as a charge holding region, a p-type semiconductor region 182 serving as a well region, and a p-type semiconductor region 183 between the semiconductor region 181 and the surface of the semiconductor substrate 10.

The photoelectric conversion apparatus APR according to the present exemplary embodiment further includes a light shielding film 58 which covers the charge holding portion 18 between the silicon oxide film 21 and the charge holding portion 18. The light shielding film 58 has an opening 580 above the photoelectric conversion portion 11. The photoelectric conversion portion 11 receives light via the opening 580. In other words, the light shielding film 58 does not overlap with a part of the photoelectric conversion portion 11 under the opening 580. The charge holding portion 18 which is optically shielded by the light shielding film 58 is provided so that a global electronic shutter function can be implemented. In the present example, the light shielding film 58 overlaps with part of the photoelectric conversion portion 11 to enhance the light shielding effect with respect to the charge holding portion 18.

A difference can occur in level between the pixel area PX and the peripheral area PR as much as the thickness of the light shielding film 58. The silicon oxide film 21 includes a portion 213 lying between the interlayer insulation film 40 and the light shielding film 58. Since the portion 212 of the silicon oxide film 21 is located in the peripheral area PR, the difference in level as much as the thickness of the light shielding film 58 can be reduced. A silicon oxide film 25 is provided between the light shielding film 58 and the silicon oxide layer 22. A portion 253 of the silicon oxide film 25 lying under the light shielding film 58 can have a planarization function of reducing a difference in the level of the underlayer of the light shielding film 58 due to the gate electrodes 41 and 42. The silicon oxide film 25 includes a portion 252 lying between the silicon oxide film 21 and the silicon nitride layer 32.

Although not illustrated in the diagrams, the light shielding film 58 is a metal containing member, and a contact plug can be formed in a contact hole running through the interlayer insulation film 40 and the silicon oxide film 21 in such a manner that the contact plug is in contact with the light shielding film 58. In such a case, a silicon nitride layer can be provided between the interlayer insulation film 40 and the silicon oxide film 21. The silicon nitride layer serves as an etching stopper of the contact hole, and is also intended to prevent metal diffusion from the light shielding film 58.

(Equipment Including Photoelectric Conversion Apparatus)

The equipment EQP illustrated in FIG. 1A will be described in detail. The photoelectric conversion apparatus APR can include the package PKG for accommodating the semiconductor device IC in addition to the semiconductor device IC including the semiconductor substrate 10. The package PKG can include a base member to which the semiconductor device IC is fixed, a glass lid which is opposed to the semiconductor device IC, and connection members such as bonding wires and bumps which connect terminals provided on the base member with terminals provided on the semiconductor device IC.

The equipment EQP can further include at least any one of the optical system OPT, the control apparatus CTRL, the processing apparatus PRCS, the display apparatus DSPL, the storage apparatus MMRY, and the mechanical apparatus MCHN. The optical system OPT forms an image on the photoelectric conversion apparatus APR. Examples of the optical system OPT include a lens, a shutter, and a mirror. The control apparatus CTRL controls the photoelectric conversion apparatus APR. Examples of the control apparatus CTRL include a semiconductor device such as an application specific integrated circuit (ASIC). The processing apparatus PRCS processes a signal output from the photoelectric conversion apparatus APR. The processing apparatus PRCS is a semiconductor device, such as a CPU and an ASIC, for constituting an analog front end (AFE) or a digital front end (DFE). The display apparatus DSPL is an electroluminescent (EL) display apparatus or liquid display apparatus which displays information (image) obtained by the photoelectric conversion apparatus APR. The memory device MMRY is a magnetic device or semiconductor device which stores the information (image) obtained by the photoelectric conversion apparatus APR. The memory apparatus MMRY is a volatile memory, such as a static random access memory (SRAM) and a dynamic random access memory (DRAM), or a nonvolatile memory, such as a flash memory and a hard disk drive. The mechanical apparatus MCHN includes a movable unit or propelling unit such as a motor and an engine. In the equipment EQP, the signal output from the photoelectric conversion apparatus APR is displayed on the display apparatus DSPL and/or transmitted to outside by a communication apparatus (not illustrated) included in the equipment EQP. For that purpose, the equipment EQP can further include the memory apparatus MMRY and the processing apparatus PRCS aside from a storage circuit unit and an arithmetic circuit unit included in the photoelectric conversion apparatus APR.

The equipment EQP illustrated in FIG. 1A can be electronic equipment such as an information terminal having an imaging function (for example, a smartphone or a wearable terminal) and a camera (for example, an interchangeable-lens camera, a compact camera, a video camera, or a surveillance camera). The mechanical apparatus MCHN of a camera can drive the parts of the optical system OPT for zooming, focusing, and a shutter operation. The equipment EQP can be transportation equipment (moving body) such as a vehicle, a ship, and a flying object. The mechanical apparatus MCHN of the transportation equipment can be used as a moving device. The equipment EQP serving as transportation equipment is suitable for equipment that transports the photoelectric conversion apparatus APR, or equipment that assists and/or automates driving (manipulation) by using an imaging function. The processing apparatus PRCS for assisting and/or automating driving (manipulation) can perform processing for operating the mechanical apparatus MCHN serving as a moving device based on information obtained by the photoelectric conversion apparatus APR.

The photoelectric conversion apparatus APR according to the present exemplary embodiment can be used for performance improvement. If the photoelectric conversion apparatus APR is mounted on transportation equipment, excellent image quality and measurement accuracy can thus be obtained in performing imaging outside the transportation apparatus or measuring the external environment. The photoelectric conversion apparatus APR can also enhance reliability to a level sufficient for mounting on equipment used in harsh environment like transportation equipment. In terms of the manufacturing and sales of transportation equipment, the determination to mount the photoelectric conversion apparatus APR according to the present exemplary embodiment on the transportation equipment is therefore advantageous in enhancing the performance of the transportation equipment.

The exemplary embodiments described above can be modified as appropriate without departing from the technical concept thereof. The disclosed contents of the exemplary embodiments include not only what is explicitly described in this specification document but all items comprehensible from this specification document and the drawings accompanying the specification document.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion apparatus comprising:
   a semiconductor substrate including a photoelectric conversion portion;
   a silicide portion provided on the semiconductor substrate;
   a first insulation layer arranged over the semiconductor substrate to cover the silicide portion;
   a dielectric region arranged over the photoelectric conversion portion and surrounded by the first insulation layer;
   a light shielding film including a portion lying between the first insulation layer and the semiconductor substrate;
   a second insulation layer arranged between the first insulation layer and the photoelectric conversion portion, a material of the second insulation layer being different from a material of the first insulation layer;
   a third insulation layer extending from a first portion arranged between the second insulation layer and the photoelectric conversion portion to a second portion arranged between the first insulation layer and the silicide portion, a material of the third insulation layer being different from the material of the second insulation layer; and a fourth insulation layer arranged between the third insulation layer and the silicide portion, a material of the fourth insulation layer being different from the material of the third insulation layer.

2. The photoelectric conversion apparatus according to claim 1, wherein a part of the second insulation layer is arranged between a bottom of the dielectric region and the third insulation layer.

3. The photoelectric conversion apparatus according to claim 1,
wherein the second insulation layer has a first area that is in contact with the dielectric region and a second area that is in contact with the first insulation layer, and
wherein a thickness of the second insulation layer at the first area is less than a thickness of the second insulation layer at the second area.

4. The photoelectric conversion apparatus according to claim 1, wherein the second portion is arranged between the second insulation layer and the fourth insulation layer.

5. The photoelectric conversion apparatus according to claim 1, wherein the material of the first insulation layer and the material of the third insulation layer are silicon oxide.

6. The photoelectric conversion apparatus according to claim 1, further comprising:
an electrode arranged on the semiconductor substrate;
wherein the silicide portion is arranged on the electrode.

7. The photoelectric conversion apparatus according to claim 6, further comprising:
a sidewall spacer that covers a side of the electrode;
wherein the fourth insulation layer is arranged between the third insulation layer and the sidewall spacer.

8. The photoelectric conversion apparatus according to claim 1, further comprising:
an impurity region provided inside the semiconductor substrate;
wherein the silicide portion is arranged on the impurity region.

9. The photoelectric conversion apparatus according to claim 1, wherein a thickness of the second insulation layer is greater than a thickness of the fourth insulation layer.

10. The photoelectric conversion apparatus according to claim 7, wherein a thickness of the second insulation layer is greater than a thickness of the fourth insulation layer.

11. The photoelectric conversion apparatus according to claim 10, wherein the material of the first insulation layer and the material of the third insulation layer are silicon oxide.

12. The photoelectric conversion apparatus according to claim 1, wherein a thickness of a thickest part of the second insulation layer is greater than a thickness of a thickest part of the fourth insulation layer.

13. The photoelectric conversion apparatus according to claim 1,
wherein the semiconductor substrate has a charge holding portion, and
wherein the light shielding film covers the charge holding portion.

14. The photoelectric conversion apparatus according to claim 1, wherein the light shielding film is arranged between the third insulation layer and the semiconductor substrate.

15. The photoelectric conversion apparatus according to claim 1, further comprising a contact plug being in contact with the silicide portion.

16. The photoelectric conversion apparatus according to claim 15,
wherein the semiconductor substrate has a charge holding portion,
wherein the light shielding film covers the charge holding portion,
wherein the contact plug runs through the third insulation layer, and
wherein a distance from an upper surface of the contact plug to an upper surface of the semiconductor substrate is longer than a distance from an upper surface of the light shielding film to the upper surface of the semiconductor substrate.

17. The photoelectric conversion apparatus according to claim 16, wherein a distance from an upper surface of the third insulation layer to the upper surface of the semiconductor substrate is longer than the distance from the upper surface of the light shielding film to the upper surface of the semiconductor substrate.

18. The photoelectric conversion apparatus according to claim 13, wherein a distance from an upper surface of the light shielding film to an upper surface of the semiconductor substrate is longer than a distance from an upper surface of the fourth insulation layer to the upper surface of the semiconductor substrate.

19. The photoelectric conversion apparatus according to claim 1, wherein the material of the second insulation layer and the material of the fourth insulation layer are silicon nitride.

20. An apparatus comprising:
the photoelectric conversion apparatus according to claim 1; and
at least one of an optical system configured to form an image on the photoelectric conversion apparatus, a control apparatus configured to control the photoelectric conversion apparatus, a processing apparatus configured to process a signal outputted from the photoelectric conversion apparatus, a mechanical apparatus controlled based on information obtained by the photoelectric conversion apparatus, a display apparatus configured to display information obtained by the photoelectric conversion apparatus, or a storage apparatus configured to store information obtained by the photoelectric conversion apparatus.

21. The photoelectric conversion apparatus according to claim 15, wherein the contact plug runs through the third insulation layer.

* * * * *